US010541127B2

(12) United States Patent
Tak et al.

(10) Patent No.: US 10,541,127 B2
(45) Date of Patent: Jan. 21, 2020

(54) MATERIAL LAYERS, SEMICONDUCTOR DEVICES INCLUDING THE SAME, AND METHODS OF FABRICATING MATERIAL LAYERS AND SEMICONDUCTOR DEVICES

(71) Applicants: Yong-suk Tak, Seoul (KR); Gi-gwan Park, Suwon-si (KR); Jin-bum Kim, Seoul (KR); Bon-young Koo, Suwon-si (KR); Ki-yeon Park, Hwaseong-si (KR); Tae-jong Lee, Hwaseong-si (KR)

(72) Inventors: Yong-suk Tak, Seoul (KR); Gi-gwan Park, Suwon-si (KR); Jin-bum Kim, Seoul (KR); Bon-young Koo, Suwon-si (KR); Ki-yeon Park, Hwaseong-si (KR); Tae-jong Lee, Hwaseong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 15/336,901

(22) Filed: Oct. 28, 2016

(65) Prior Publication Data
US 2017/0133219 A1 May 11, 2017

(30) Foreign Application Priority Data

Nov. 6, 2015 (KR) .................. 10-2015-0155794

(51) Int. Cl.
H01L 21/02 (2006.01)
C23C 16/455 (2006.01)
(Continued)

(52) U.S. Cl.
CPC .. *H01L 21/02126* (2013.01); *C23C 16/45529* (2013.01); *C23C 16/45542* (2013.01);
(Continued)

(58) Field of Classification Search
CPC ... C23C 16/308; C23C 16/325; C23C 16/345; C23C 16/347; C23C 16/36;
(Continued)

(56) References Cited

U.S. PATENT DOCUMENTS 6,468,924 B2 10/2002 Lee et al.
6,962,869 B1 11/2005 Bao et al.
(Continued)

FOREIGN PATENT DOCUMENTS

JP 2005-310927 11/2005
JP 3793179 4/2006
JP 5208294 3/2013

*Primary Examiner* — Elizabeth A Burkhart
(74) *Attorney, Agent, or Firm* — Myers Bigel, P.A.

(57) ABSTRACT

A material layer, a semiconductor device including the material layer, and methods of forming the material layer and the semiconductor device are provided herein. A method of forming a SiOCN material layer may include supplying a silicon source onto a substrate, supplying a carbon source onto the substrate, supplying an oxygen source onto the substrate, supplying a nitrogen source onto the substrate, and supplying hydrogen onto the substrate. When a material layer is formed according to a method of the present inventive concepts, a material layer having a high tolerance to wet etching and/or good electric characteristics may be formed, and may even be formed when the method is performed at a low temperature.

16 Claims, 29 Drawing Sheets

(51) Int. Cl.

| | |
|---|---|
| *C23C 16/50* | (2006.01) |
| *H01L 21/28* | (2006.01) |
| *H01L 29/06* | (2006.01) |
| *H01L 29/08* | (2006.01) |
| *H01L 29/16* | (2006.01) |
| *H01L 29/161* | (2006.01) |
| *H01L 29/423* | (2006.01) |
| *H01L 29/49* | (2006.01) |
| *H01L 29/51* | (2006.01) |
| *H01L 29/66* | (2006.01) |
| *H01L 29/78* | (2006.01) |
| *H01L 29/786* | (2006.01) |

(52) U.S. Cl.
CPC .......... *C23C 16/50* (2013.01); *H01L 21/0228* (2013.01); *H01L 21/02211* (2013.01); *H01L 21/02274* (2013.01); *H01L 21/28088* (2013.01); *H01L 29/0653* (2013.01); *H01L 29/0673* (2013.01); *H01L 29/0847* (2013.01); *H01L 29/16* (2013.01); *H01L 29/161* (2013.01); *H01L 29/1608* (2013.01); *H01L 29/42392* (2013.01); *H01L 29/4966* (2013.01); *H01L 29/4983* (2013.01); *H01L 29/517* (2013.01); *H01L 29/66545* (2013.01); *H01L 29/7851* (2013.01); *H01L 29/78618* (2013.01); *H01L 29/78651* (2013.01); *H01L 29/78681* (2013.01); *H01L 29/78684* (2013.01); *H01L 29/78696* (2013.01)

(58) Field of Classification Search
CPC ............ C23C 16/401; C23C 16/45525; C23C 16/45542; H01L 21/02126

USPC .................................................... 427/249.15

See application file for complete search history.

(56) References Cited

U.S. PATENT DOCUMENTS

| | | |
|---|---|---|
| 7,150,789 B2 | 12/2006 | Castovillo et al. |
| 7,358,194 B2 | 4/2008 | Dip et al. |
| 7,442,656 B2 | 10/2008 | Matsuura |
| 7,625,609 B2 | 12/2009 | Matsuura |
| 7,972,663 B2 | 7/2011 | Wang et al. |
| 8,465,811 B2 | 6/2013 | Ueda |
| 8,575,042 B2 | 11/2013 | Ota et al. |
| 8,591,989 B2 | 11/2013 | Chou et al. |
| 8,647,722 B2 | 2/2014 | Kobayashi et al. |
| 8,895,455 B2 | 11/2014 | Akae et al. |
| 8,956,984 B2 | 2/2015 | Okuda |
| 9,887,080 B2 * | 2/2018 | Moon ..................... C23C 16/30 |
| 2005/0223982 A1 | 10/2005 | Park et al. |
| 2006/0022228 A1 | 2/2006 | Hoshi et al. |
| 2011/0076857 A1 * | 3/2011 | Akae ...................... C23C 16/32 |
| | | 438/769 |
| 2013/0149874 A1 * | 6/2013 | Hirose ............. H01L 21/02271 |
| | | 438/763 |
| 2013/0273747 A1 * | 10/2013 | Sano ................. H01L 21/0228 |
| | | 438/778 |
| 2014/0315393 A1 | 10/2014 | Ozaki et al. |
| 2015/0162185 A1 | 6/2015 | Pore |
| 2015/0206736 A1 * | 7/2015 | Akae .................. H01L 21/0228 |
| | | 438/786 |
| 2015/0228474 A1 * | 8/2015 | Hanashima ......... H01L 21/0228 |
| | | 438/778 |

* cited by examiner

MATERIAL LAYERS, SEMICONDUCTOR DEVICES INCLUDING THE SAME, AND METHODS OF FABRICATING MATERIAL LAYERS AND SEMICONDUCTOR DEVICES

CROSS-REFERENCE TO RELATED PATENT APPLICATION

This application claims the benefit of and priority to Korean Patent Application No. 10-2015-0155794, filed on Nov. 6, 2015, in the Korean Intellectual Property Office, the disclosure of which is incorporated herein in its entirety by reference.

FIELD

The present inventive concepts relate generally to a material layer, a semiconductor device including a material layer, and methods of fabricating a material layer and a semiconductor device. The present inventive concepts further relate to a material layer having a high etching resistance and good electrical characteristics, a semiconductor device including the material layer, and methods of fabricating the material layer and/or the semiconductor device.

BACKGROUND

A tolerance to wet etching is an important factor for a material layer that is used as a spacer of a semiconductor device. However, the tolerance to wet etching may be degraded when an unnecessary component of a precursor remains within the material layer. In obtaining minute patterns, the use of a material susceptible to high temperatures has been increasing. When a material layer is formed at certain temperatures, electrical characteristics or a physical property, such as etching resistance, may not be met.

SUMMARY OF EXAMPLE EMBODIMENTS

The present inventive concepts provide a method of forming a SiOCN material layer having a high tolerance to wet etching and/or good electrical characteristics even when prepared at a low temperature.

The present inventive concepts provide a material layer stack having a high etching resistance and/or good electrical characteristics.

The present inventive concepts provide a semiconductor device including a material layer stack having a high tolerance to etching and/or good electrical characteristics.

The present inventive concepts provide a method of forming a low-dielectric constant material layer having a high tolerance to etching and good electrical characteristics even when prepared at a low temperature.

The present inventive concepts provide a deposition apparatus for forming a low-dielectric constant material layer having a high tolerance to etching and/or good electrical characteristics.

According to an aspect of the present inventive concepts, there is provided a method of forming a SiOCN material layer, the method including: supplying a silicon source onto a substrate; supplying a carbon source onto the substrate; supplying an oxygen source onto the substrate; and supplying hydrogen onto the substrate, thereby forming the SiOCN material layer.

According to another aspect of the present inventive concepts, there is provided a method of forming a SiOCN material layer, the method including: supplying a silicon source onto a substrate; supplying a carbon source onto the substrate after the supplying of the silicon source; supplying an oxygen source onto the substrate after the supplying of the carbon source; and supplying a nitrogen source onto the substrate after the supplying of the oxygen source, thereby forming the SiOCN material layer.

According to another aspect of the present inventive concepts, there is provided a material layer stack including a semiconductor substrate; and a SiOCN material layer formed on the semiconductor substrate, wherein a halogen element content of the SiOCN material layer is about 0.35 atom % or less.

According to another aspect of the present inventive concepts, there is provided a semiconductor device including a semiconductor substrate; an isolation layer defining an active area of the semiconductor substrate; a gate electrode that extends over the active area and has two opposing sidewalls; a spacer on each of the two opposing sidewalls of the gate electrode; and an impurity region on each of the two opposing sidewalls of the gate electrode, wherein the spacer on each of the two opposing sidewalls includes an SiOCN material layer, and a halogen element content in the SiOCN material layer is about 0.35 atom % or less.

According to another aspect of the present inventive concepts, there is provided a semiconductor device including a semiconductor substrate; an isolation layer defining an active area that protrudes from the semiconductor substrate in a fin shape and extends in a first direction; a gate electrode having opposing sides provided on the active area and extending in a direction intersecting with the first direction, the gate electrode intersecting with the active area and covering two opposing sidewalls of the active area and an upper surface of the active area between the two opposing sidewalls; a source/drain spacer provided on each of the two opposing sidewalls of the active area; and a source/drain region provided on each of the opposing sides of the gate electrode and on at least a portion of the active area. The source/drain spacer provided on each of the two opposing sidewalls includes a SiOCN material layer, and a dielectric constant of the SiOCN material layer is in a range of about 3.5 to about 5.5.

According to another aspect of the present inventive concepts, there is provided a method of forming a low-dielectric constant material layer, the method including supplying a silicon source onto a substrate; supplying hydrogen onto the substrate after the supplying of the silicon source; and supplying an additional component source onto the substrate after the supplying of the hydrogen.

According to another aspect of the present inventive concepts, there is provided a vapor deposition apparatus for forming a low-dielectric constant material layer, the vapor deposition apparatus including a reaction chamber that defines a reaction space; a support in the reaction space, wherein the support supports a substrate; a first transfer line configured to introduce source materials into the reaction space; a second transfer line configured to introduce hydrogen into the reaction space; and a temperature controller configured to heat the substrate to a desired temperature.

According to another aspect of the present inventive concepts, there is provided a method of forming a SiOCN material layer, the method including: performing a first deposition cycle that includes separately supplying hydrogen and a silicon source onto a substrate, and performing a second deposition cycle after the first deposition cycle, wherein the second deposition cycle includes supplying the silicon source onto the substrate and does not include supplying the hydrogen onto the substrate, thereby forming the SiOCN material layer.

BRIEF DESCRIPTION OF THE DRAWINGS

Example embodiments of the present inventive concepts will be more clearly understood from the following detailed description taken in, conjunction with the accompanying drawings.

FIGS. 12A to 12C illustrate a semiconductor device having a low-dielectric constant material layer on a semiconductor substrate according to an example embodiment of the present inventive concepts, wherein FIG. 12A is a plan view of the semiconductor device, FIG. 12B is a perspective view of the semiconductor device, and FIG. 12C is a lateral cross-sectional view of the semiconductor device.

DETAILED DESCRIPTION OF EXAMPLE EMBODIMENTS

An example embodiment of the present inventive concepts provides a semiconductor substrate and a material layer stack including a low-dielectric constant material layer formed on the semiconductor substrate. The low-dielectric constant material layer may denote a material layer having a dielectric constant of less than 8.

Figure 1:
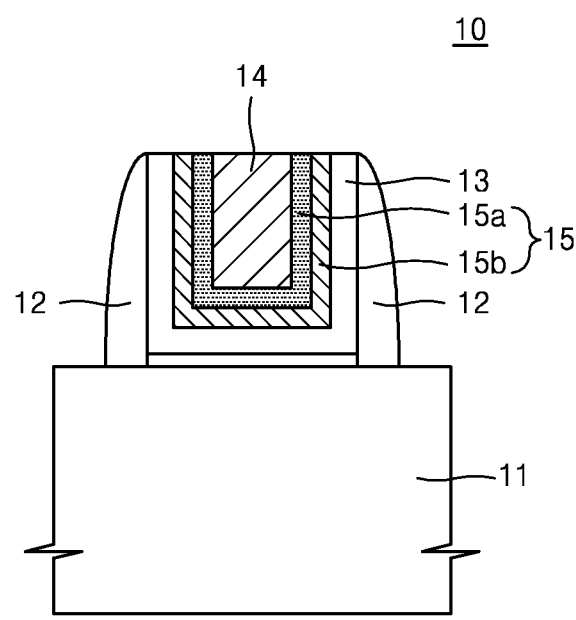
FIG. 1 is a lateral cross-sectional view of a material layer stack including a semiconductor substrate and a low-dielectric constant material layer formed on the semiconductor substrate according to an example embodiment of the present inventive concepts.

FIG. 1 is a lateral cross-sectional view of a material layer stack 10 including a semiconductor substrate 11 and a low-dielectric constant material layer 12 formed on the semiconductor substrate 11, according to an example embodiment of the present inventive concepts.

Referring to FIG. 1, the semiconductor substrate 11 may be formed of at least one of a Group III and V elements-containing material and a Group IV element-containing material. The Group III and V elements-containing material may be a binary, ternary, or quaternary compound including at least one Group III element and at least one Group V element. The Group III and V elements-containing material may be a compound including, as a Group III element, at least one of In, Ga, and Al and, as a Group V element, at least one of As, P, and Sb. For example, the Group III and V elements-containing material may be selected from InP, $In_zGa_{1-z}As$ ($0 \leq z \leq 1$), and $Al_zGa_{1-z}As$ ($0 \leq z \leq 1$). The binary compound may, for example, be one of InP, GaAs, InAs, InSb and GaSb. The ternary compound may, for example, be one of InGaP, InGaAs, AlInAs, InGaSb, GaAsSb, and GaAsP. The Group IV element-containing material may, for example, be Si and/or Ge. However, a Group III and V elements-containing material and a Group IV element-containing material that are usable to form a thin film according to the technical spirit of the present inventive concepts are not limited to the aforementioned materials.

The Group III and V elements-containing material and the Group IV element-containing material, such as, e.g., Ge, may each be used as a channel material capable of forming a low-power and high-speed transistor. A high-performance CMOS may be formed using a semiconductor substrate formed of a Group III and V elements-containing material, for example, GaAs, having higher mobility of electrons than a Si substrate, and a SiGe semiconductor substrate including a semiconductor material, for example, Ge, having higher mobility of holes than a Si substrate. According to some embodiments, when an N-type channel is intended to be formed on the semiconductor substrate 11, the semiconductor substrate 11 may be formed of one of the above-exemplified Group III and V elements-containing materials or may be formed of SiC. According to some other embodiments, when a P-type channel is intended to be formed on the semiconductor substrate 11, the semiconductor substrate 11 may be formed of SiGe.

The low-dielectric constant material layer 12 may be a material layer containing silicon (Si), oxygen (O), carbon (C), boron (B), and/or nitrogen (N). For example, the low-dielectric constant material layer 12 may include a SiOCN, SiBCN, SiBN, SiCN, and/or SiOC material layer. According to some embodiments, the low-dielectric constant material layer 12 may be a SiOCN, SiBCN, SiBN, SiCN, and/or SiOC material layer. According to some embodiments, the low-dielectric constant material layer 12 may be a stack of at least two of the SiOCN, SiBCN, SiBN, SiCN, and/or SiOC material layers.

The low-dielectric constant material layer 12 may include carbon in an amount of about 8 atom % to about 30 atom %. According to some embodiments, the low-dielectric constant material layer 12 may include carbon in an amount of about 8 atom % to about 30 atom % when being analyzed by X-ray photoelectron spectroscopy (XPS). According to some embodiments, the low-dielectric constant material layer 12 may include carbon in an amount of about 11 atom % to about 20 atom %. If the carbon content of the low-dielectric constant material layer 12 is too low, etching resistance to a wet etching agent of the low-dielectric constant material layer 12 may be insufficient.

According to some embodiments, the low-dielectric constant material layer 12 may include oxygen in an amount of about 32 atom % to about 50 atom %. In some embodiments, the oxygen content of the low-dielectric constant material layer 12 may be about 32 atom % to about 50 atom % when being analyzed by XPS. If the oxygen content of the low-dielectric constant material layer 12 is less than 32 atom %, a dielectric constant value of the low-dielectric constant material layer 12 may not be sufficiently small.

A halogen element content of the low-dielectric constant material layer 12 may be about 0.35 atom % or less. According to some embodiments, the halogen element content of the low-dielectric constant material layer 12 may be about 0.35 atom % or less when being analyzed by XPS. A concentration of a halogen element in the low-dielectric constant material layer 12 may be greater than 0 atom % and no greater than about 0.32 atom % over an entire thickness of the low-dielectric constant material layer 12. According to some embodiments, a concentration of the halogen element in the low-dielectric constant material layer 12 may be greater than 0 atom % and no greater than about 0.32 atom % over the entire thickness of the low-dielectric constant material layer 12 when being analyzed by XPS. If the low-dielectric constant material layer 12 has a halogen element content exceeding 0.35 atom %, then the low-dielectric constant material layer 12 may have insufficient etching resistance to hydrofluoric acid (HF).

The concentration of a halogen element in the low-dielectric constant material layer 12 may change according to locations over the entire thickness of the low-dielectric constant material layer 12 by no less than 0 atom % to no more than about 0.07 atom %. According to some embodiments, a change in the concentration of a halogen element in the low-dielectric constant material layer 12 may be no less than 0 atom % to no more than about 0.07 atom % over the entire thickness of the low-dielectric constant material layer 12 when being analyzed by XPS. If a change in the concentration of a halogen element exceeds 0.07 atom % over the overall thickness of the low-dielectric constant material layer 12, a concentration of the halogen element at a specific depth may excessively increase. This may mean that etching resistance to HF at this location may be insufficient. The halogen element may be at least one of fluorine (F), chlorine (Cl), bromine (Br), and iodine (I).

The low-dielectric constant material layer 12 may have a dielectric constant in a range of about 3.5 to about 5.5. If the dielectric constant of the low-dielectric constant material layer 12 is greater than 5.5, desired electric characteristics may not be provided. The low-dielectric constant material layer 12 may have a dielectric constant of less than 3.5, but may not be easily fabricated.

The low-dielectric constant material layer 12 may be provided directly on the semiconductor substrate 11 or may be provided on the semiconductor substrate 11 with another material layer interposed between the low-dielectric constant material layer 12 and the semiconductor substrate 11. According to some embodiments, the low-dielectric constant material layer 12 may be stacked on the semiconductor substrate 11 with an insulation layer interposed therebetween. According to some embodiments, the low-dielectric constant material layer 12 may be stacked on the semiconductor substrate 11 with an $HfO_2$, $ZrO_2$, HfSiOx, TaSiOx, and/or LaOx layer interposed therebetween.

Although a thickness of the low-dielectric constant material layer 12 is not constant in FIG. 1, the low-dielectric constant material layer 12 may have a substantially constant thickness in some embodiments.

According to some embodiments, the low-dielectric constant material layer 12 may be formed over a surface of the metal material layer 14 and may be spaced apart from and/or contact the surface of the metal material layer 14. The metal material layer 14 may include at least one of titanium (Ti), tungsten (W), aluminum (Al), ruthenium (Ru), niobium (Nb), hafnium (Hf), nickel (Ni), cobalt (Co), platinum (Pt), ytterbium (Yb), terbium (Tb), dysprosium (Dy), erbium (Er), and palladium (Pd).

According to some embodiments, the low-dielectric constant material layer 12 may be formed on carbide, nitride, silicide, and/or aluminum carbide of the metals that constitute the metal material layer 14, or on any combination thereof.

The low-dielectric constant material layer 12 may be formed directly on the metal material layer 14 or may be provided on the metal material layer 14 with a material layer different from the SiOCN material layer 12 interposed therebetween.

According to some embodiments, the low-dielectric constant material layer 12 may be provided on the surface of the metal material layer 14 with a high-dielectric constant material layer 13 interposed therebetween. The high-dielectric constant material layer 13 may be formed of a material having a dielectric constant in a range of, for example, about 10 to about 25. According to some embodiments, the high-dielectric constant material layer 13 may be formed of a material selected from hafnium oxide, hafnium oxynitride, hafnium silicon oxide, lanthanum oxide, lanthanum aluminum oxide, lanthanum silicon oxide, zirconium oxide, zirconium silicon oxide, tantalum oxide, tantalum hafnium oxide, tantalum aluminum oxide, tantalum silicon oxide, tantalum zirconium oxide, titanium oxide, titanium aluminum oxide, barium strontium titanium oxide, barium titanium oxide, strontium titanium oxide, yttrium oxide, erbium oxide, dysprosium oxide, gadolinium oxide, gallium oxide, aluminum oxide, aluminum silicon oxide, silicon germanium oxide, lead scandium tantalum oxide, lead zinc niobate, and any combination thereof.

According to some embodiments, the low-dielectric constant material layer 12 may be provided on the metal material layer 14 with a physical property adjustment functional layer 15 interposed therebetween. The physical property adjustment functional layer 15 may include a barrier metal layer 15a and a work function adjustment layer 15b.

The work function adjustment layer 15b may be an N-type or P-type work function adjustment layer. When the work function adjustment layer 15b is an N-type work function adjustment layer, the work function adjustment layer 15*b* may include a material selected from, for example, TiAl, TiAlN, TaC, TiC, and HfSi. However, the present inventive concepts are not limited to this. When the work function adjustment layer 15*b* is a P-type work function adjustment layer, the work function adjustment layer 15*b* may include a material selected from, for example, Mo, Pd, Ru, Pt, TiN, WN, TaN, Ir, TaC, RuN, and MoN. However, the present inventive concepts are not limited to this.

The barrier metal layer 15*a* may, for example, be TiN.

A method of fabricating a material layer stack according to example embodiments of the present inventive concepts will now be described. According to some embodiments, a method of the present invention may reduce and/or decrease halogen atom content in a material layer and/or steric hindrance due to a halogen atom in a material layer, which may increase and/or improve wet etch resistance, increase carbon atom content in the material layer, and/or allow and/or provide for a low temperature process to be performed.

Figure 2:
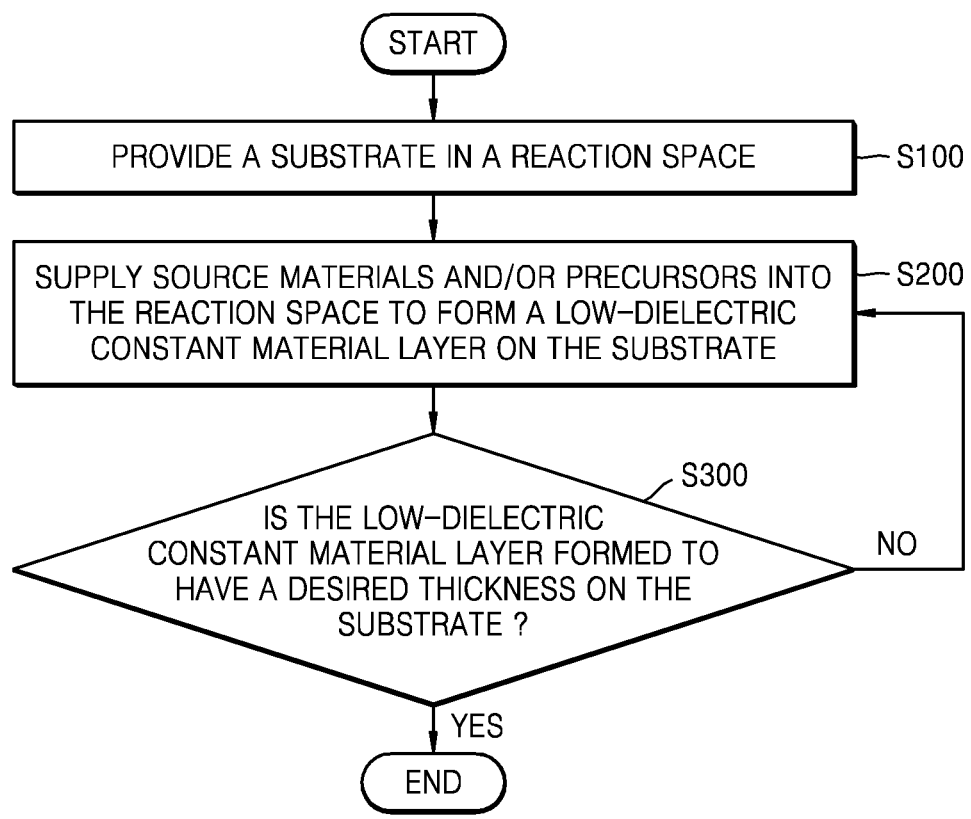
FIG. 2 is a flowchart of a method of fabricating a material layer stack according to an example embodiment of the present inventive concepts.

FIG. 2 is a flowchart of a method of fabricating a material layer stack according to an example embodiment of the present inventive concepts.

Referring to FIG. 2, a substrate may be provided in a reaction space such as, e.g., a chamber, in operation S100. For example, providing a substrate in a reaction space in operation S100 may include carrying a substrate into a reaction space such as, e.g., a chamber. To form a low-dielectric constant material layer on the substrate, source materials and/or precursors may be supplied into the reaction space, in operation S200. Then, in operation S300, it may be determined if the low-dielectric constant material layer is formed to have a desired thickness on the substrate. If yes, then the substrate may be removed from (e.g., carried out of) the reaction space. If no, then operation S200 may be continued and/or performed again.

Formation of the low-dielectric constant material layer on the substrate in operation S200 may be performed using an arbitrary method known to one of ordinary skill in the art. According to some embodiments, the low-dielectric constant material layer may be formed by chemical vapor deposition (CVD). According to some embodiments, the low-dielectric constant material layer may be formed by atomic layer deposition (ALD). In some embodiments, the low-dielectric constant material layer may be formed by plasma enhanced ALD (PEALD). However, the present inventive concepts are not limited to these methods.

Formation of the low-dielectric constant material layer on the substrate by PEALD will now be described. However, one of ordinary skill in the art may form a low-dielectric constant material layer by using another method by referring to the description below.

Figure 3:
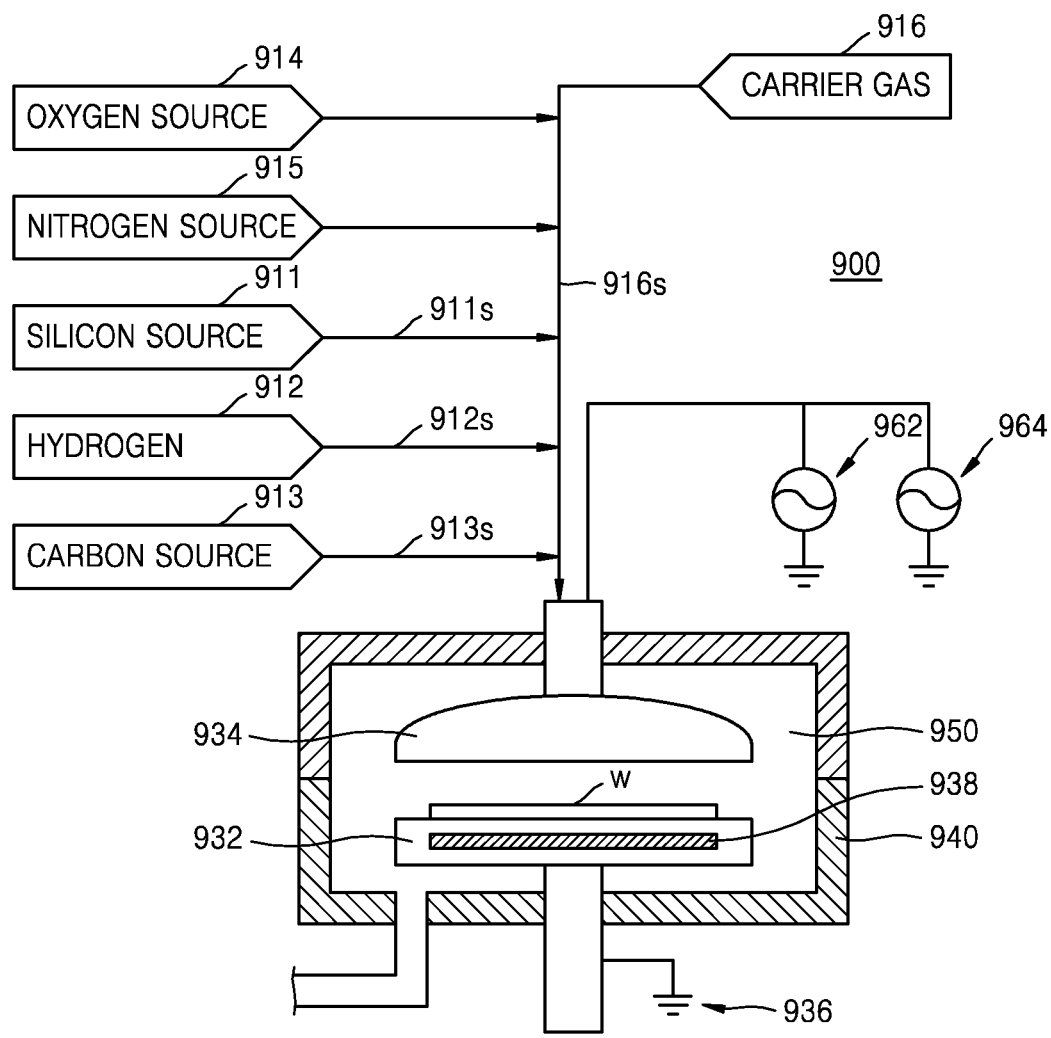
FIG. 3 is a conceptual diagram of plasma enhanced atomic layer deposition (PEALD) equipment for forming a low-dielectric constant material layer according to an example embodiment of the present inventive concepts.

FIG. 3 is a conceptual diagram of PEALD equipment 900 for forming the low-dielectric constant material layer, according to an example embodiment of the present inventive concepts.

Referring to FIG. 3, a pair of conductive flat panel electrodes 932 and 934 facing each other and extending in parallel are provided within a reaction space 950, which is the inside of a reaction chamber 940. 13.56 MHz or 27 MHz HRF power 962 (and LRF power 964 of no more than 5 MHz (400 kHz to 500 kHz) as needed) is applied to one of the conductive flat panel electrodes 932 and 934, and the other electrode is electrically grounded as indicated by reference numeral 936. Thus, plasma is excited between the conductive flat panel electrodes 932 and 934.

A lower electrode 932 may serve as a support that supports a substrate W, and a temperature controller 938 may be built into the lower electrode 932 to maintain the substrate W at a constant temperature. As will be described in detail below, according to some embodiments of the present inventive concepts, a low-dielectric constant material layer with a high oxygen and carbon content is able to be deposited at a temperature in a range of about 400° C. to about 700° C., or even at a relatively low temperature in a range of about 450° C. to about 630° C. Moreover, a low-dielectric constant material layer with a high oxygen and carbon content may be deposited even at a lower temperature, namely, at about 500° C. or less, according to the type of carbon source used. Accordingly, the temperature controller 938 may be configured to adjust a temperature of the substrate W to 700° C. or less, such as, e.g., 630° C. or less or 500° C. or less.

An upper electrode 934 may serve as a shower head as well as an electrode. According to some embodiments, several gases including a process gas may be introduced into the reaction space 950 via the upper electrode 934. According to some embodiments, some gases may be introduced into the reaction space 950 via respective unique pipes of the gases.

A carrier gas 916 may convey different sources and/or precursors to the reaction space 950. According to some embodiments, the carrier gas 916 may purge an unreacted material and/or reaction by-product within the reaction space 950.

The carrier gas 916 may be, for example, an inert gas such as helium (He) and/or neon (Ne), and/or an extremely-low active gas such as nitrogen ($N_2$) and/or carbon dioxide ($CO_2$). However, the present inventive concepts are not limited to this.

A silicon source 911 may be introduced into the reaction space 950 via a silicon source supply line 911*s*. In some embodiments, the silicon source supply line 911*s* may be joined to a carrier gas supply line 916*s*.

In some embodiments, a carrier gas supply line 916*s* may be connected to a silicon source supply line 911*s* for the silicon source 911, a hydrogen supply line 912*s* for hydrogen 912, a carbon source supply line 913*s* for a carbon source 913, and/or to supply lines for an oxygen source 914 and/or a nitrogen source 915 as shown in FIG. 3. One or more of the supply lines may be connected directly to the reaction chamber 940 instead of independently being connected to the carrier gas supply line 916*s* for the carrier gas 916. In some embodiments, if there is a concern and/or knowledge that a gas remaining in a pipe between supply cycles may react with a subsequently supplied material, then the supply line(s) may not be connected to the carrier gas supply line 916*s* for the carrier gas 916.

Silicon Source

The silicon source may be a silane-based silicon precursor substituted by halogen, such as, for example, monofluoro silane ($SiFH_3$), defluoro silane ($SiF_2H_2$), trifluoro silane ($SiF_3H$), tetrafluoro silane ($SiF_4$), monofluoro silane disilane ($Si_2FH_5$), defluoro disilane ($Si_2F_2H_4$), trifluoro disilane ($Si_2F_3H_3$), tetrafluoro disilane ($Si_2F_4H_2$), pentafluoro disilane ($Si_2F_5H$), hexafluoro disilane ($Si_2F_6$), monochloro silane ($SiClH_3$), dechloro silane ($SiCl_2H_2$), trichloro silane ($SiCl_3H$), tetrachloro silane ($SiCl_4$), monochloro disilane ($Si_2ClH_5$), dechloro disilane (Si2Cl2H4), trichloro disilane (Si2Cl3H3), tetrachloro disilane ($Si_2Cl_4H_2$), pentachloro disilane ($Si_2Cl_5H$), hexachloro disilane ($Si_2Cl_6$), monobromo silane ($SiBrH_3$), debromo silane ($SiBr_2H_2$), tribromo silane ($SiBr_3H$), tetrabromo silane ($SiBr_4$), monobromo disilane (Si$_2$BrH$_5$), debromo disilane (Si$_2$Br$_2$H$_4$), tribromo disilane (Si$_2$Br$_3$H$_3$), tetrabromo disilane (Si$_2$Br$_4$H$_2$), pentabromo disilane (Si$_2$Br$_5$H), hexabromo disilane (Si$_2$Br$_6$), monoiodo silane (SiIH$_3$), deiodo silane (SiI$_2$H$_2$), triiodo silane (SiI$_3$H), tetraiodo silane (SiI$_4$), monoiodo disilane (Si$_2$IH$_5$), deiodo disilane (Si$_2$I$_2$H$_4$), triiodo disilane (Si$_2$I$_3$H$_3$), tetraiodo disilane (Si$_2$I$_4$H$_2$), pentaiodo disilane (Si$_2$I$_5$H), and/or hexaiodo disilane (Si$_2$I$_6$).

In some embodiments, the silicon source may be diethyl silane (Et$_2$SiH$_2$), tetraethyl orthosilicate (Si(OCH$_2$CH$_3$)$_4$, TEOS), or alkyl amino silane-based compounds, but the present inventive concepts are not limited thereto. The alkyl amino silane-based compound may include, for example, diisopropylan amino silane (H$_3$Si(N(i-Prop)$_2$)), bis (tertiarybutylan amino) silane ((C$_4$H$_9$(H)N)$_2$SiH$_2$), tetrakise (dimethylan amino) silane (Si(NMe$_2$)$_4$), tetrakise (ethylmethylan amino) silane (Si(NEtMe)$_4$), tetrakise (diethylan amino) silane (Si(NEt$_2$)$_4$), tris (dimethylan amino) silane (HSi(NMe$_2$)$_3$), tris (ethylmethylan amino) silane (HSi(NEtMe)$_3$), tris (diethylan amino) silane (HSi(NEt$_2$)$_3$), tris (dimethyl hydrazino) silane (HSi(N(H)NMe$_2$)$_3$), bis (diethylan amino) silane (H$_2$Si(NEt$_2$)$_2$), bis(diisopropylan amino) silane (H$_2$Si(N(i-Prop)$_2$)$_2$), tris (isopropylan amino) silane (HSi(N(i-Prop)$_2$)$_3$), and/or (diisopropylan amino) silane (H$_3$Si(N(i-Prop)$_2$)), but the present inventive concepts are not limited thereto.

As used herein, Me represents a methyl group, Et represents an ethyl group, and i-Prop represents an iso-propyl group.

Carbon Source

The carbon source may be at least one selected from an alkane having a carbon number of 1 to 10, an alkene having a carbon number of 2 to 10, an alkylamine having a carbon number of 1 to 15, a nitrogen-containing heterocyclic compound having a carbon number of 4 to 15, an alkylsilane having a carbon number of 1 to 20, an alkoxysilane having a carbon number of 1 to 20, and/or an alkylsiloxane having a carbon number of 1 to 20.

The alkane having a carbon number of 1 to 10 may be methane, ethane, propane, butane (all isomers), pentane (all isomers), hexane (all isomers), heptane (all isomers), octane (all isomers), nonane (all isomers), decane (all isomers), or a mixture thereof.

The alkene having a carbon number of 2 to 10 may be ethylene, propylene, butene (all isomers), hexene (all isomers), heptene (all isomers), octene (all isomers), nonene (all isomers), decene (all isomers), or a mixture thereof.

The alkylamine having a carbon number of 1 to 15 may have, for example, the formula NR$^1$R$^2$R$^3$, wherein R$^1$, R$^2$, and R$^3$ may each independently be selected from hydrogen, an halogen element, alkyl having a carbon number of 1 to 10, alkenyl having a carbon number of 2 to 10, alkylamino having a carbon number of 1 to 10, aryl having a carbon number of 6 to 12, aryl alkyl having a carbon number of 7 to 12, alkyl aryl having a carbon number of 7 to 12, and cycloalkyl having a carbon number of 5 to 12. In some embodiments, at least one of R$^1$, R$^2$, and R$^3$ is an alkyl having a carbon number of 1 to 10. According to some embodiments, two of R$^1$, R$^2$, and R$^3$ may be connected to each other to form a ring. According to some embodiments, two or more alkylamines may be connected to each other to form an alkyldiamine, alkyltriamine, or the like, and the alkyldiamine, alkyltriamine, or the like may form an alkylamine having a carbon number of 1 to 15.

The nitrogen-containing heterocyclic compound having a carbon number of 4 to 15 may be at least one of compounds having a structure represented by Formula 1 to Formula 8:

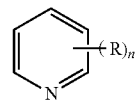

[Formula 1]

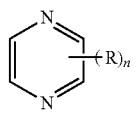

[Formula 2a]

[Formula 2b]

[Formula 2c]

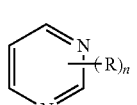

[Formula 3]

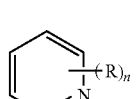

[Formula 4a]

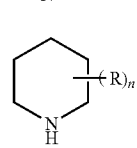

[Formula 4b]

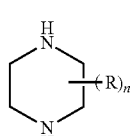

[Formula 4c]

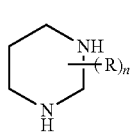

[Formula 5]

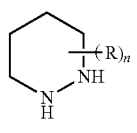

[Formula 6a]

[Formula 6b]

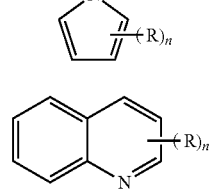

[Formula 7a]

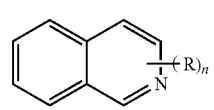

[Formula 7b]

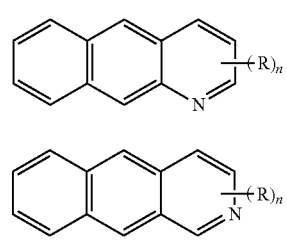

-continued

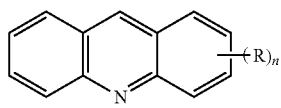
[Formula 7c]

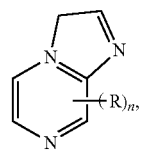
[Formula 8]

wherein n indicates an integer of 1 to 4 and R may each independently be selected from hydrogen, alkyl having a carbon number of 1 to 10, alkenyl having a carbon number of 2 to 10, aryl having a carbon number of 6 to 12, aryl alkyl having a carbon number of 7 to 12, alkyl aryl having a carbon number of 7 to 12, and cycloalkyl having a carbon number of 5 to 12.

The alkylsilane having a carbon number of 1 to 20 may have, for example, the formula $R^1$—$(SiR^2R^3)$n-$R^4$, wherein, n is an integer of 1 to 12 and $R^1$, $R^2$, $R^3$, and $R^4$ may each independently be selected from hydrogen, an halogen element, alkyl having a carbon number of 1 to 10, alkenyl having a carbon number of 1 to 10, alkylamino having a carbon number of 1 to 10, aryl having a carbon number of 6 to 12, aryl alkyl having a carbon number of 7 to 12, alkyl aryl having a carbon number of 7 to 12, and cycloalkyl having a carbon number of 5 to 12. In some embodiments, at least one of $R^1$, $R^2$, $R^3$, and $R^4$ includes a carbon atom that is directly combined with and/or attached to Si. According to some embodiments, $R^1$ and $R^4$ may be connected to each other to form a ring.

The alkoxysilane having a carbon number of 1 to 20 is a compound in which substituted or unsubstituted alkoxy groups are bonded to a silicon atom at the center, and may have, for example, the formula $R^1$—$(SiR^2R^3)$n-$R^4$, wherein, n is an integer of 1 to 12 and $R^1$, $R^2$, $R^3$, and $R^4$ may each independently be selected from hydrogen, an halogen element, alkyl having a carbon number of 1 to 10, alkoxy having a carbon number of 1 to 10, alkenyl having a carbon number of 1 to 10, alkylamino having a carbon number of 1 to 10, aryl having a carbon number of 6 to 12, aryl alkyl having a carbon number of 7 to 12, alkyl aryl having a carbon number of 7 to 12, and cycloalkyl having a carbon number of 5 to 12. In some embodiments, at least one of $R^1$, $R^2$, $R^3$, and $R^4$ is alkoxy having a carbon number of 1 to 10, and at least one of $R^1$, $R^2$, $R^3$, and $R^4$ includes a carbon atom that is directly combined with and/or attached to Si. According to some embodiments, $R^1$ and $R^4$ may be connected to each other to form a ring.

The alkylsiloxane having a carbon number of 1 to 20 may include two or more silicon atoms connected to each other with oxygen atoms interposed therebetween, and may have, for example, the formula $R^1$—$([SiR^2R^3]$—O)n-$R^4$, wherein, n is an integer of 2 to 12 and $R^1$, $R^2$, $R^3$, and $R^4$ may each independently be selected from hydrogen, an halogen element, alkyl having a carbon number of 1 to 10, alkoxy having a carbon number of 1 to 10, alkenyl having a carbon number of 1 to 10, alkylamino having a carbon number of 1 to 10, aryl having a carbon number of 6 to 12, aryl alkyl having a carbon number of 7 to 12, alkyl aryl having a carbon number of 7 to 12, and cycloalkyl having a carbon number of 5 to 12. In some embodiments, at least one of $R^1$, $R^2$, $R^3$, and $R^4$ includes a carbon atom that is directly combined with and/or attached to Si. According to some embodiments, $R^1$ and $R^4$ may be connected to each other to form a ring.

In some embodiments, at least one of alkylsilane having a carbon number of 1 to 20, alkoxysilane having a carbon number of 1 to 20, and alkylsiloxane having a carbon number of 1 to 20, as described above, may have a molecular weight in a range of about 50 to about 1000 Daltons. According to some embodiments, at least one selected from alkylsilane having a carbon number of 1 to 20, alkoxysilane having a carbon number of 1 to 20, and alkylsiloxane having a carbon number of 1 to 20 may have a molecular weight in a range of about 100 to about 400 Daltons.

Oxygen Source and Nitrogen Source

The oxygen source may be, for example, $O_3$, $H_2O$, $O_2$, $NO_2$, NO, $N_2O$, $H_2O$, alcohol, metal alkoxide, plasma $O_2$, remote plasma $O_2$, plasma $N_2O$, plasma $H_2O$, or any combination thereof. The nitrogen source may be, for example, $N_2$, $NH_3$, hydrazine ($N_2H_4$), plasma $N_2$, remote plasma $N_2$, or any combination thereof.

Boron Source

The boron source may be, for example, a borane-based boron precursor substituted by halogen, such as borane ($BH_4$), diborane ($B_2H_6$), monofluoro borane ($BFH_3$), difluoro borane ($BF_2H_2$), trifluoro borane ($BF_3H$), tetrafluoro borane ($BF_4$), monofluoro diborane ($B_2FH_5$), difluoro diborane ($B_2F_2H_4$), trifluoro diborane ($B_2F_3H_3$), tetrafluoro diborane ($B_2F_4H_2$), pentafluoro diborane ($B_2F_5H$), hexafluoro diborane ($B_2F_6$), monochloro borane ($BClH_3$), dichloro borane ($BCl_2H_2$), trichloro borane ($BCl_3H$), tetrachloro borane ($BCl_4$), monochloro diborane ($B_2ClH_5$), dichloro diborane ($B_2Cl_2H_4$), trichloro diborane ($B_2Cl_3H_3$), tetrachloro diborane ($B_2Cl_4H_2$), pentachloro diborane ($B_2Cl_5H$), hexachloro diborane ($B_2Cl_6$), monobromo borane ($BBrH_3$), dibromo borane ($BBr_2H_2$), tribromo borane ($BBr_3H$), tetrabromo borane ($BBr_4$), monobromo diborane ($B_2BrH_5$), dibromo diborane ($B_2Br_2H_4$), tribromo diborane ($B_2Br_3H_3$), tetrabromo diborane ($B_2Br_4H_2$), pentabromo diborane ($B_2Br_5H$), hexabromo diborane ($B_2Br_6$), monoiodo borane ($BIH_3$), diiodo borane ($BI_2H_2$), triiodo borane ($BI_3H$), tetraiodo borane ($BI_4$), monoiodo diborane ($B_2IH_5$), diiodo diborane ($B_2I_2H_4$), triiodo diborane ($B_2I_3H_3$), tetraiodo diborane ($B_2I_4H_2$), pentaiodo diborane ($B_2I_5H$), and/or hexaiodo diborane ($B_2I_6$).

In some embodiments, the boron reactant may be an alkyl substituted borane, alkyl substituted diborane, borazine ($B_3N_3H_6$), or alkyl substituted derivatives thereof. However, embodiments of the present inventive concepts are not limited thereto.

A sequence in which the above-described process gases are supplied into the reaction space 950 according to an example embodiment of the present inventive concepts will now be described.

Figure 4A:
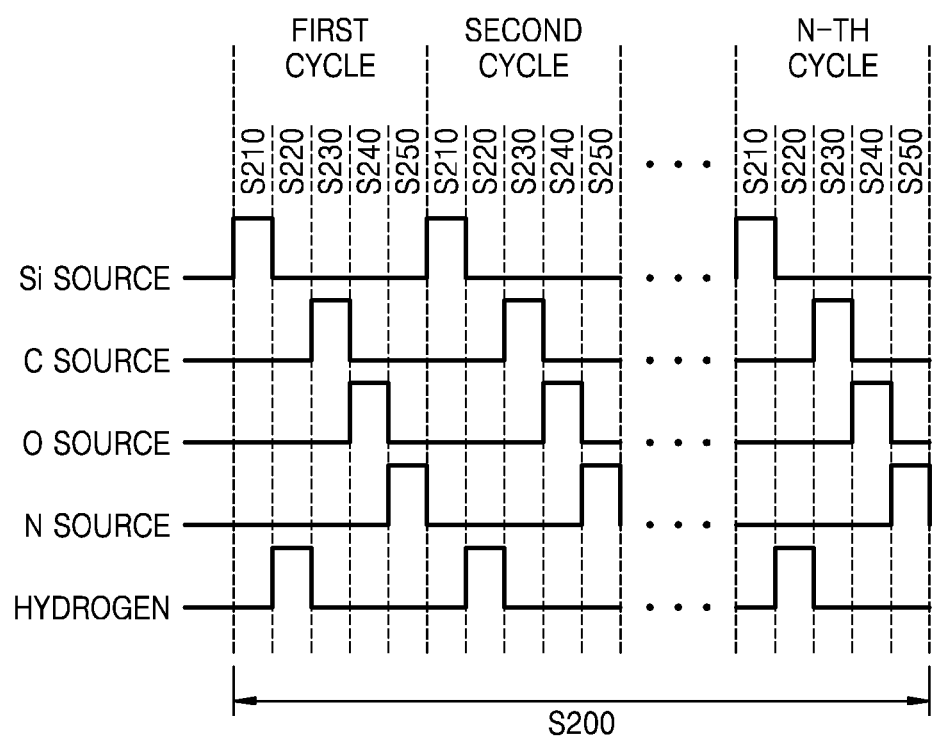
FIG. 4A is a timing diagram of supply cycles for process gases according to an example embodiment of the present inventive concepts.
Figure 4B:
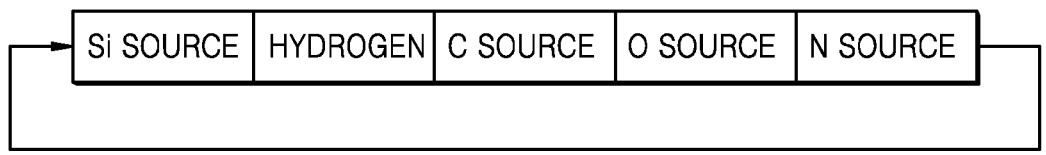
FIG. 4B is a block diagram of a supply sequence for the process gases according to an example embodiment of the present inventive concepts.

FIG. 4A is a timing diagram of supply cycles of process gases according to an example embodiment of the present inventive concepts. FIG. 4B is a block diagram of a supply sequence of the process gases according to an example embodiment of the present inventive concepts. Formation of a SiOCN material layer will first be described, and another material layer will be described later in detail.

Referring to FIGS. 4A and 4B, a silicon source may be supplied in operation S210, and then hydrogen ($H_2$) may be supplied in operation S220. Since the silicon source has been described above, an additional description thereof will be omitted.

When hexachlorodisilanes (HCDs) are supplied as the Si source, a chemical bond between two silicon atoms of the HCDs may be broken and the silicon atoms may then bond with a substrate. In other words, two —SiCl$_3$ bonds may be formed on the substrate. Since a chlorine group is large, a steric hindrance may hinder other molecules, such as, for example, a subsequently-supplied carbon source from being adhered to the substrate or reacting with silicon.

Without being limited to any particular theory, when hydrogen is supplied right after the silicon source is supplied, the hydrogen may replace the chlorine group. Consequently, the size of an atom combined with a silane group decreases, and, thus, a steric hindrance may be minimized and a subsequently-supplied carbon source may more smoothly and/or readily react with the substrate and/or silicon atom(s). A carbon content of a material layer may greatly affect a tolerance to wet etching. When the tolerance to wet etching is too low, use of the material layer as a spacer or the like of a gate electrode may be restricted.

Moreover, when a chlorine content of the material layer increases regardless of the carbon content, a tolerance to wet etching may degrade. In other words, when the chlorine content of the material layer increases, although the carbon content is not changed, the tolerance to wet etching may degrade. Therefore, chlorine atoms may be removed by supplying hydrogen as in operation S220, thereby lowering a concentration of chlorine atoms within a formed material layer. Consequently, a material layer having a relatively-high tolerance to wet etching may be obtained.

Then, in operations S230, S240, and S250, a carbon source, an oxygen source, and a nitrogen source, respectively, may be sequentially supplied. Although a purging process between supplies of source materials is not specified in FIGS. 4A and 4B, one of ordinary skill in the art may understand that a purge gas may be supplied between one or more supplies of source materials. The purge gas may, for example, be an inert gas such as helium (He) and/or neon (Ne), and/or an extremely-low active gas such as nitrogen (N$_2$) and/or carbon dioxide (CO$_2$). However, the present inventive concepts are not limited to this.

The operations of supplying the silicon source, the hydrogen, the carbon source, the oxygen source, and the nitrogen source may form a cycle. The cycle may be repeated one or more times (e.g., N times) until the entire material layer is formed and/or a desired thickness for the material layer is obtained. Although each of the cycles is illustrated to begin with supplying of the silicon source and end with supplying of the nitrogen source, one of ordinary skill in the art would understand that each cycle may be defined to begin with supplying of the hydrogen source of a cycle S220 and end with supplying of the silicon source of the next cycle S210 with reference to FIG. 4A.

The operations of supplying the silicon source, the hydrogen, the carbon source, the oxygen source, and the nitrogen source may respectively include operations in which the silicon source, the hydrogen, the carbon source, the oxygen source, and the nitrogen source are independently activated by plasma. In other words, when a chamber temperature is relatively low, energy necessary for forming a material layer may be supplied by supplying RF power for forming plasma. According to some embodiments, RF power for forming plasma may be supplied only in one or two of the operations of supplying the silicon source, the carbon source, the oxygen source, and the nitrogen source. According to some embodiments, RF power for forming plasma may be supplied in all of the operations of supplying the silicon source, the carbon source, the oxygen source, and the nitrogen source.

In some embodiments, plasma may not be formed in the operation of supplying hydrogen. In other words, RF power may not be supplied in the operation of supplying hydrogen. In addition, external plasma may not be introduced into a chamber in the operation of supplying hydrogen. Accordingly, even when plasma is able to be remotely generated, external plasma may not be introduced into the chamber during at least the operation of supplying hydrogen. However, a temperature of a substrate may be increased to about 400° C. to about 700° C. by using the temperature controller 938 of FIG. 3 as described above with reference to FIG. 3.

Figure 5A:
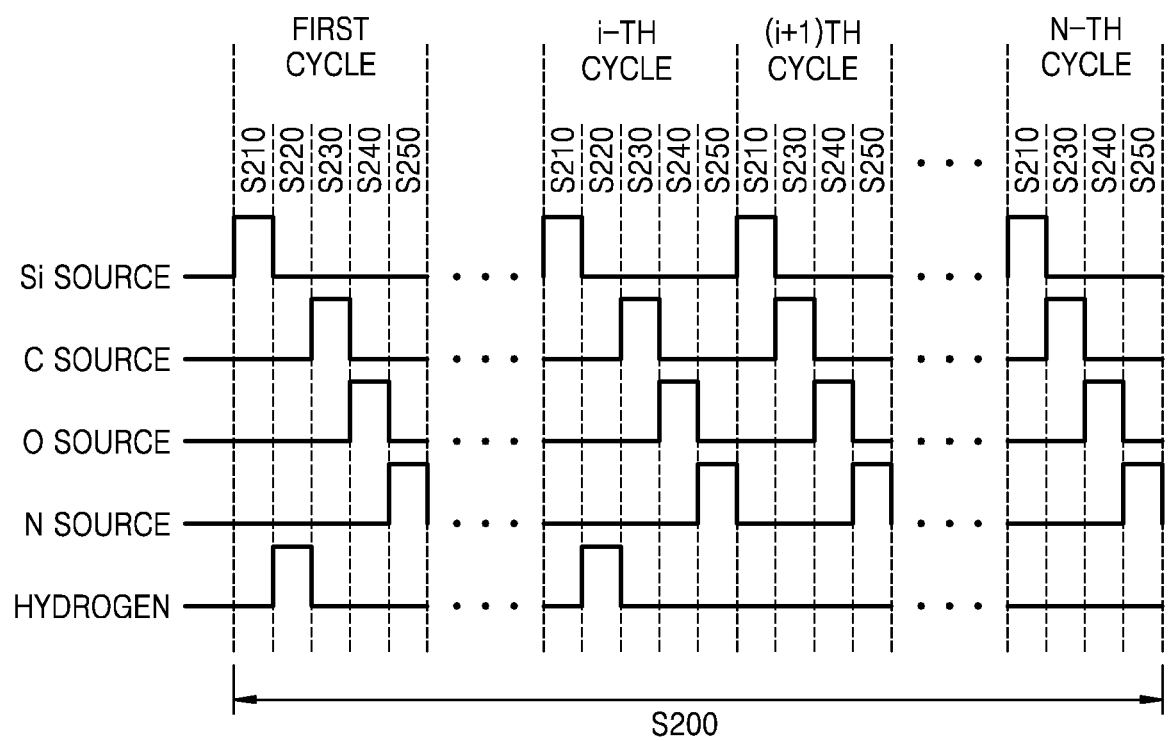
FIG. 5A is a timing diagram of supply cycles for process gases according to an example embodiment of the present inventive concepts.
Figure 5B:
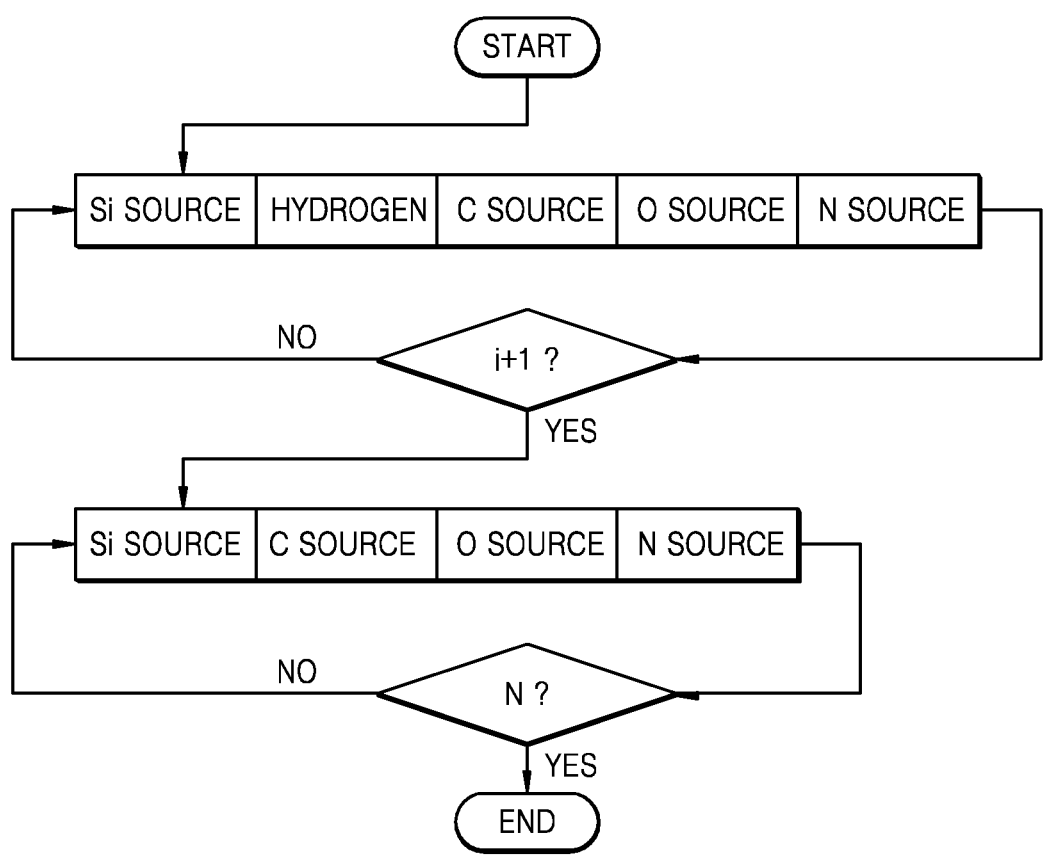
FIG. 5B is a block diagram of a supply sequence for the process gases according to an example embodiment of the present inventive concepts.

FIG. 5A is a timing diagram of supply cycles of process gases according to another example embodiment of the present inventive concepts. FIG. 5B is a block diagram of a supply sequence of the process gases according to an example embodiment of the present inventive concepts.

Referring to FIGS. 5A and 5B, a silicon source may be supplied in operation S210, and then hydrogen (H$_2$) may be supplied in operation S220. Then, in operations S230, S240, and S250, a carbon source, an oxygen source, and a nitrogen source, respectively, may be sequentially supplied. Since these operations have already been described above in detail with reference to FIGS. 4A and 4B, an additional description thereof will be omitted.

The operations of supplying the silicon source, the hydrogen, the carbon source, the oxygen source, and the nitrogen source may form a cycle. As shown in FIGS. 5A and 5B, the cycle may be repeated until an i-th cycle is performed. The value i may vary depending on the characteristics of a material layer intended to be formed, and is not particularly limited. For example, when a material layer is to be formed that has a lower halogen content, the relatively larger value i may be selected. Alternatively, when a material layer having a higher tolerance to wet etching is to be obtained, the relatively larger value i may be selected.

After the i-th cycle, an (i+1)$^{th}$ cycle may be performed, which does not include the operation of supplying hydrogen S220. In other words, a cycle comprised of the operations of supplying the silicon source, the carbon source, the oxygen source, and the nitrogen source may be repeated and/or performed after the i-th cycle. The present cycle (i.e., the i-th cycle) may be performed until an N-th cycle. According to some embodiments of the present inventive concepts, since the operation of supplying hydrogen is omitted from the (i+1)th cycle and those up until the N-th cycle, a material layer may be formed more rapidly than the embodiment described above with reference to FIGS. 4A and 4B.

In some embodiments, the temperature of the substrate may be maintained at an increased state while the first to i-th cycles are being performed. For example, the substrate may be maintained at a temperature in a range of about 400° C. to about 700° C. or in a range of about 450° C. to about 630° C. According to some embodiments, a material layer may be formed at a decreased and/or lower temperature during the (i+1)th cycle to the N-th cycle compared to the temperature for the first cycle to the i-th cycle.

However, even in this case, the operations of supplying a silicon source, a carbon source, an oxygen source, and a nitrogen source may respectively include operations in which the silicon source, the carbon source, the oxygen source, and the nitrogen source are independently activated by plasma. RF power for forming plasma may not be supplied in the operation of supplying hydrogen.

Figure 6A:
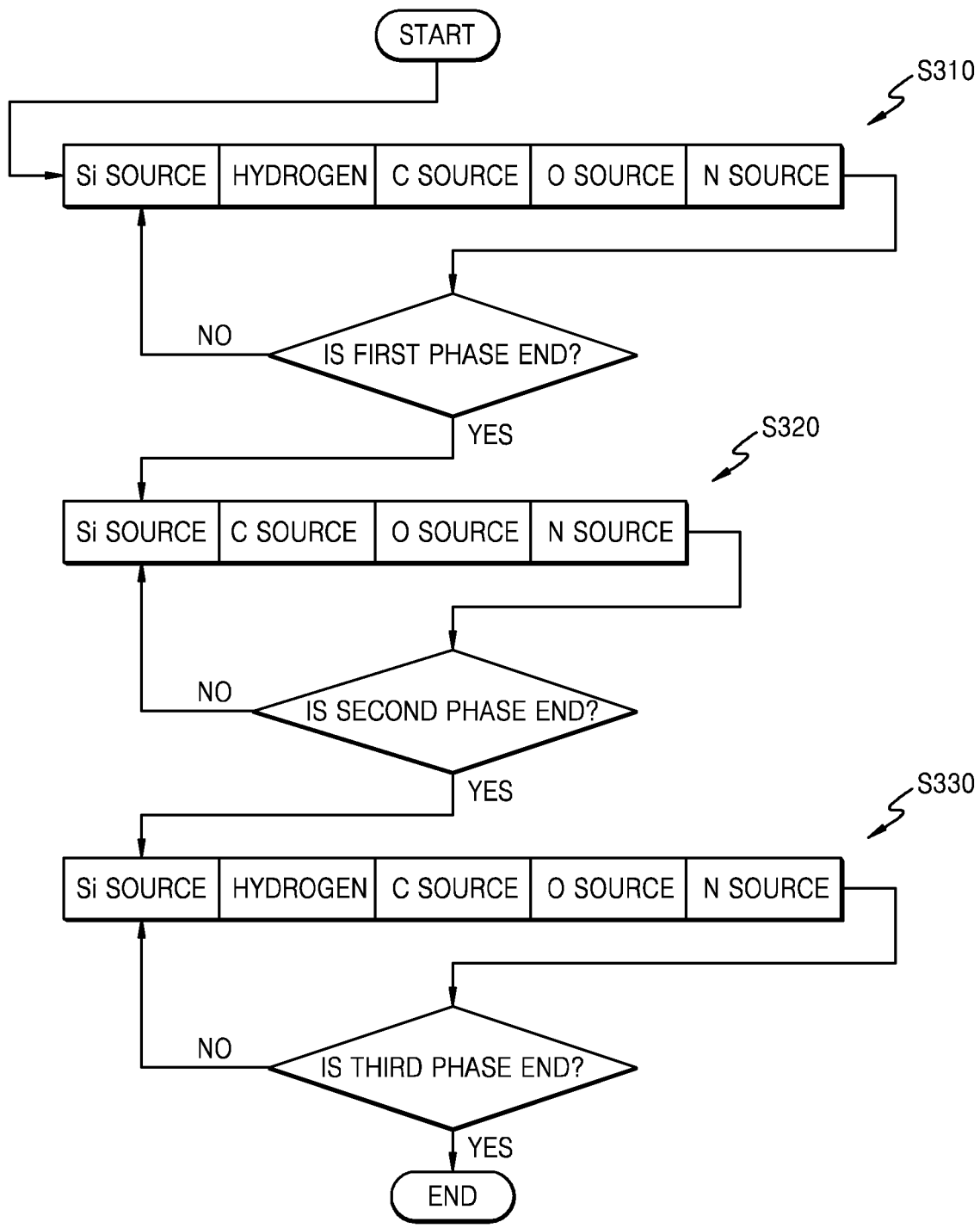
FIG. 6A is a block diagram of a supply sequence for process gases according to an example embodiment of the present inventive concepts.
Figure 6B:
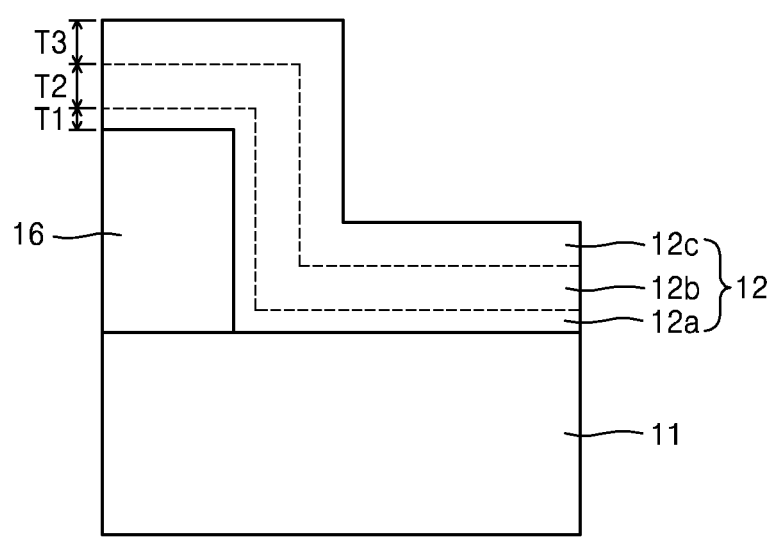
FIG. 6B is a cross-sectional view conceptually illustrating a low-dielectric constant material layer formed according to the example embodiment of FIG. 6A.

FIG. 6A is a block diagram of a supply sequence of process gases according to another example embodiment of the present inventive concepts. FIG. 6B is a cross-sectional view of a low-dielectric constant material layer 12 formed on a surface of a substrate 11 and a surface of a predetermined geographical feature 16 according to the embodiment of FIG. 6A.

Referring to FIGS. 6A and 6B, in a first phase and a third phase, the operations of supplying a silicon source, hydrogen, a carbon source, an oxygen source, and a nitrogen source form a cycle, in operations S310 and S330. During the first phase, a first layer 12a of a low-dielectric constant material layer 12 may be formed to have a first thickness T1. During the third phase, a third layer 12c of the low-dielectric constant material layer 12 may be formed to have a third thickness T3.

In a second phase, the operations of supplying the silicon source, the carbon source, the oxygen source, and the nitrogen source form a cycle, in operation S320. During the second phase, a second layer 12b of the low-dielectric constant material layer 12 may be formed to have a second thickness T2.

The first layer 12a, the second layer 12b, and the third layer 12c do not need to have the same thickness. For example, in some embodiments, the second thickness T2 may be greater than the first thickness T1. In some embodiments, the second thickness T2 may be greater than the third thickness T3. According to some embodiments, the first, second, and third thicknesses T1, T2, and T3 may be substantially the same as one another.

Figure 6C:
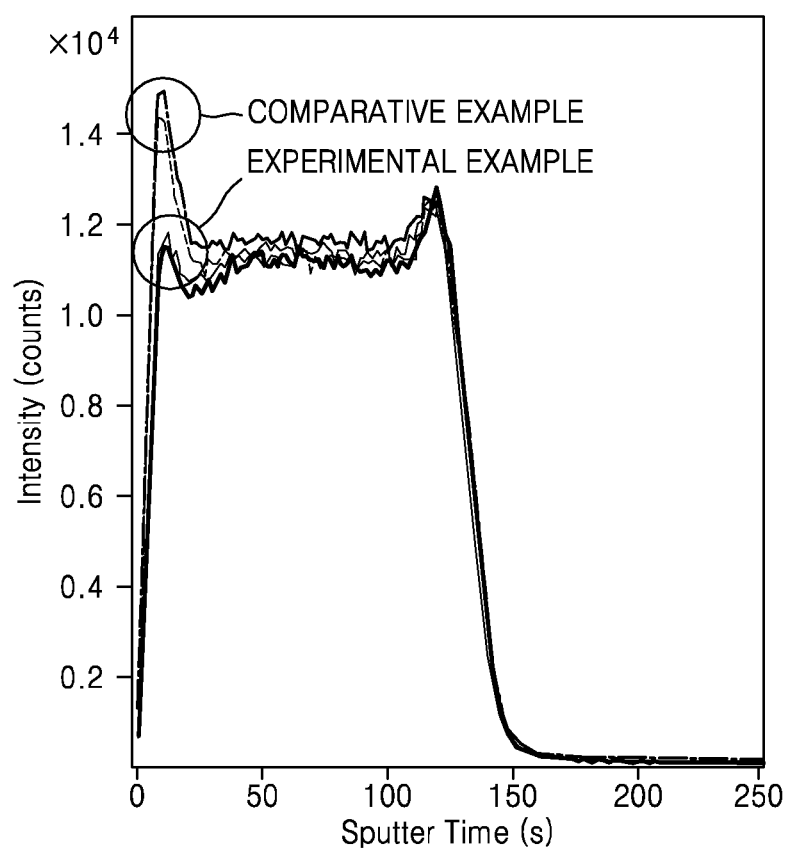
FIG. 6C is a graph showing a chlorine atom content of a material layer (experimental example) obtained while supplying and thermally treating a hydrogen gas at each cycle, according to a depth of the material layer, and a chlorine atom content of a material layer (comparative example) obtained without supplying and thermally treating a hydrogen gas at each cycle, according to a depth of the material layer.

FIG. 6C is a graph showing a chlorine atom content according to a depth of a material layer. The material layer of the experimental example was obtained by supplying a hydrogen gas and performing thermal treatment at each cycle, while the material layer of comparative example was obtained by omitting supplying a hydrogen gas and performing thermal-treatment at each cycle. The horizontal axis of FIG. 6C may be understood as being equivalent to a depth of a material layer. The left side of the horizontal axis denotes a free surface side of the material layer and the right side thereof denotes the side of an interface between the material layer and a substrate, and a rapidly falling portion of a curve may correspond to the interface between the material layer and the substrate.

As shown in FIG. 6C, the chlorine atom content tends to concentrate on the free surface side and the side of the interface with the substrate, and, it is not apparent in FIG. 6C whether the chlorine atom content decreases in sections between the two sides even when the hydrogen gas is supplied and thermally treated. Moreover, the chlorine atom content on the free surface side is greatly lower in the experimental example than in the comparative example.

Thus, when supply and thermal treatment of a hydrogen gas are performed, desirable results are obtained with respect to the free surface side, and the supply and thermal treatment of the hydrogen gas does not need to be performed over the entire thickness of the material layer.

Referring back to FIGS. 6A and 6B, since the chlorine atom content on the side of the interface with the substrate and on the free surface side, which is an uppermost portion of the material layer, are high, a hydrogen gas may be supplied and thermally treated in the first phase and the third phase in order to lower the chlorine atom content. According to some embodiments, the temperature of the substrate may be increased in the first phase and the third phase.

According to the embodiment of FIG. 6A, an operation of supplying hydrogen may be added only during the cycle(s) of the first phase and the third phase, and the operation of supplying hydrogen may be omitted during the cycle(s) of the second phase.

According to some embodiments, the operation of supplying hydrogen may be more frequently performed during the first phase and the third phase than during the second phase. For example, the operation of supplying hydrogen may be performed at each cycle during the first phase and the third phase, and the operation of supplying hydrogen may be performed at intervals of a plurality of cycles during the second phase. This will now be described in greater detail with reference to FIGS. 7A and 7B.

Figure 7A:
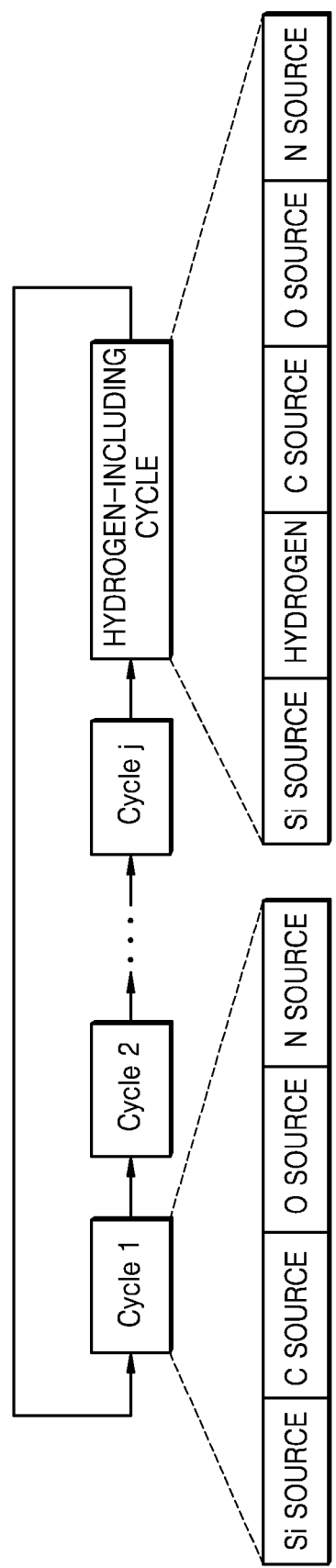
FIGS. 7A and 7B are block diagrams of supply sequences for process gases according to example embodiments of the present inventive concepts.
Figure 7B:
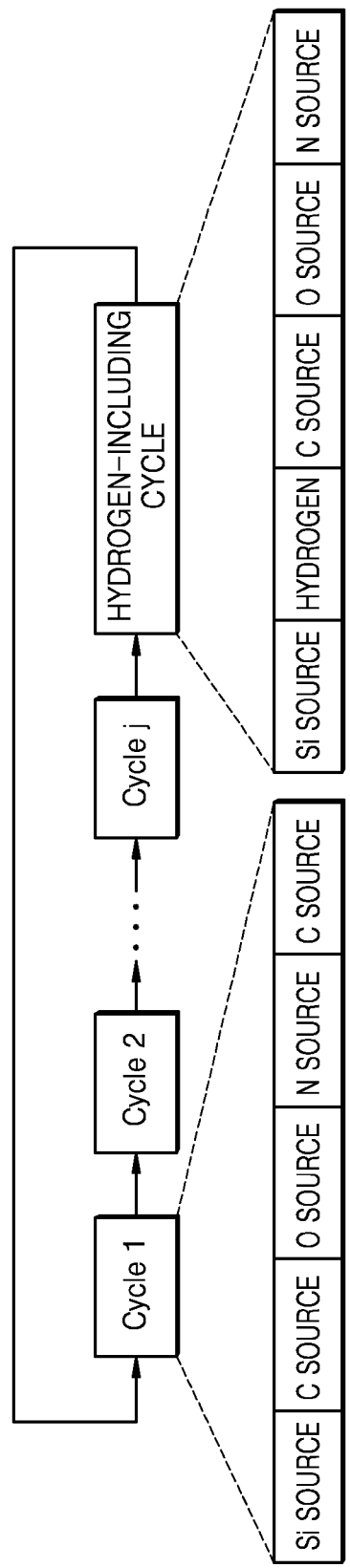

FIGS. 7A and 7B are block diagrams of supply sequences of process gases according to an example embodiment of the present inventive concepts.

Referring to FIG. 7A, operations of supplying a silicon source, a carbon source, an oxygen source, and a nitrogen source form a vapor deposition cycle. In other words, an operation of supplying hydrogen may not exist within the vapor deposition cycle.

After the vapor deposition cycle is consecutively performed j times, a hydrogen-including cycle including the operation of supplying hydrogen may be performed.

In other words, the hydrogen-including cycle may not be performed during the j vapor deposition cycles, and the hydrogen-including cycle may be performed after j vapor deposition cycles. The value j may be a value in the range of, for example, 1 to 2000, or in the range of, for example, 5 to 100, but the present inventive concepts are not limited thereto.

However, while a desired material layer is being formed, the value j does not necessarily need to be constant. In other words, while a desired material layer is being formed, the frequency of the operation of supplying hydrogen may be changed. In other words, the operation of supplying hydrogen may be irregularly performed over the entire thickness of the material layer desired to be formed.

When the hydrogen-including cycle is performed after the j vapor deposition cycles are completed, the temperature of the substrate may be increased. The increased temperature of the substrate may be controlled to a temperature in a range of about 400° C. to about 700° C. or about 450° C. to about 630° C.

Then, the vapor deposition cycle may be performed again j times, and then the hydrogen-including cycle may be performed again.

Referring to FIGS. 6A and 7A, the hydrogen-including cycle may be controlled to be relatively frequently performed by decreasing the value j in the first phase and the third phase. In some embodiments, the hydrogen-including cycle may be controlled to be relatively rarely performed by increasing the value j in the second phase.

FIG. 7B is different from the embodiment of FIG. 7A in that an operation of supplying a carbon source is additionally performed one time after an operation of supplying a nitrogen source in a cycle and before an operation of supplying a silicon source in the next cycle.

As described above, since a tolerance to wet etching improves with an increase in a carbon content, a material layer having a high carbon content may be pursued. To achieve this, the operation of supplying a carbon source may be performed twice within a single vapor deposition cycle, thereby increasing the carbon content. Even when the number of times the operation of supplying a carbon source is performed changes from one time to two times, the carbon content of the material layer may not be increased proportionally.

Although a case of forming a SiOCN material layer has been described above, a method of forming a low-dielectric constant material layer having another component will now be described.

Figure 8:
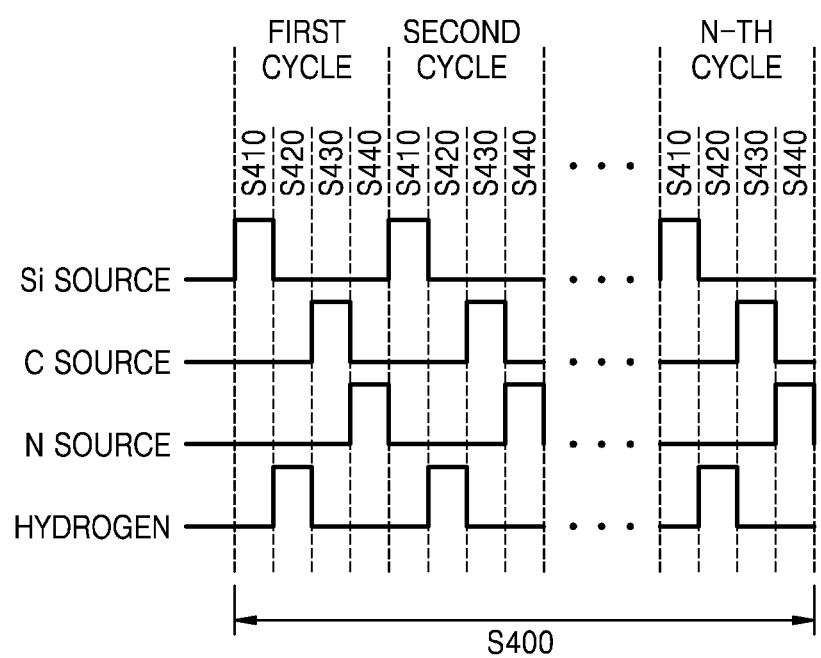
FIG. 8 is a timing diagram of supply cycles for process gases for forming a SiCN material layer according to an example embodiment of the present inventive concepts.

FIG. 8 is a timing diagram of supply cycles of process gases for forming a SiCN material layer, according to an example embodiment of the present inventive concepts.

Referring to FIG. 8, after a silicon source is supplied in pulses in operation S410, a hydrogen gas may be supplied in pulses in operation S420. Then, in operations S430 and S440, a carbon source and a nitrogen source, respectively, may be sequentially supplied in pulses. Depending on the type of compound supplied, the sequence of supplying the carbon source and the nitrogen source may be changed. In some embodiments, hydrogen may be supplied after the silicon source is supplied. Only a purging operation may exist between the operation of supplying a silicon source and the operation of supplying hydrogen.

In FIG. 8, the operation of supplying hydrogen is included in all deposition cycles. However, according to another embodiment, as described above with reference to FIGS. 6A-7B, the operation of supplying hydrogen may be included in only some of the deposition cycles. Thus, the operation of supplying hydrogen may be included non-uniformly over the entire deposition process. In other words, the number of the deposition cycles between two supplying steps of hydrogen varies over the entire deposition process.

Figure 9:
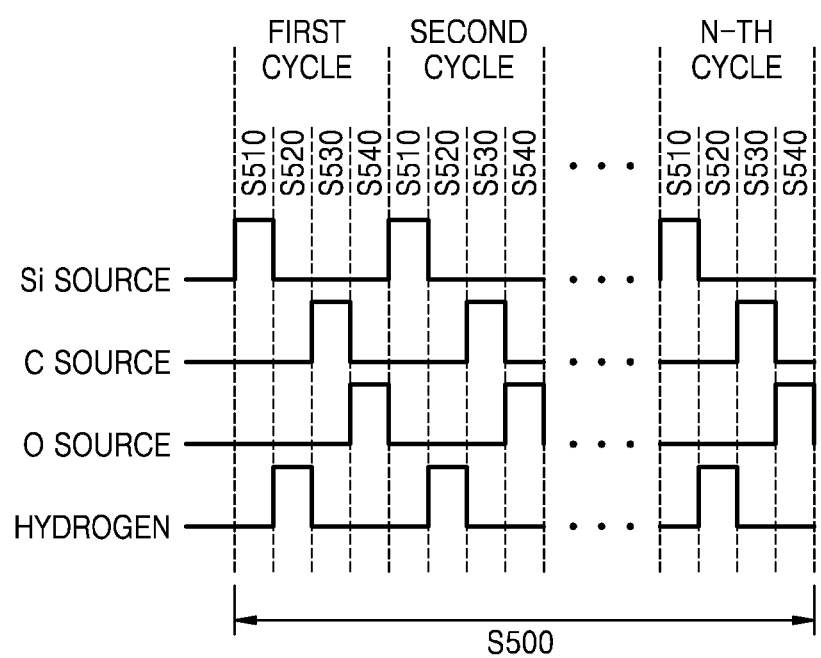
FIG. 9 is a timing diagram of supply cycles for process gases for forming a SiCO material layer according to an example embodiment of the present inventive concepts.

FIG. 9 is a timing diagram of supply cycles of process gases for forming a SiCO material layer according to an example embodiment of the present inventive concepts.

Referring to FIG. 9, after a silicon source is supplied in pulses in operation S510, a hydrogen gas may be supplied in pulses in operation S520. Then, in operations S530 and S540, a carbon source and an oxygen source, respectively, may be sequentially supplied in pulses. Depending on the type of compound supplied, the sequence of supplying the carbon source and the oxygen source may be changed. In some embodiments, hydrogen may be supplied after the silicon source is supplied. Only a purging operation may exist between the operation of supplying a silicon source and the operation of supplying hydrogen.

In FIG. 9, the operation of supplying hydrogen is included in all vapor deposition cycles. However, according to another embodiment, as described above with reference to FIGS. 6A-7B, the operation of supplying hydrogen may be non-uniformly distributed within and/or over the entire vapor deposition process.

Figure 10:
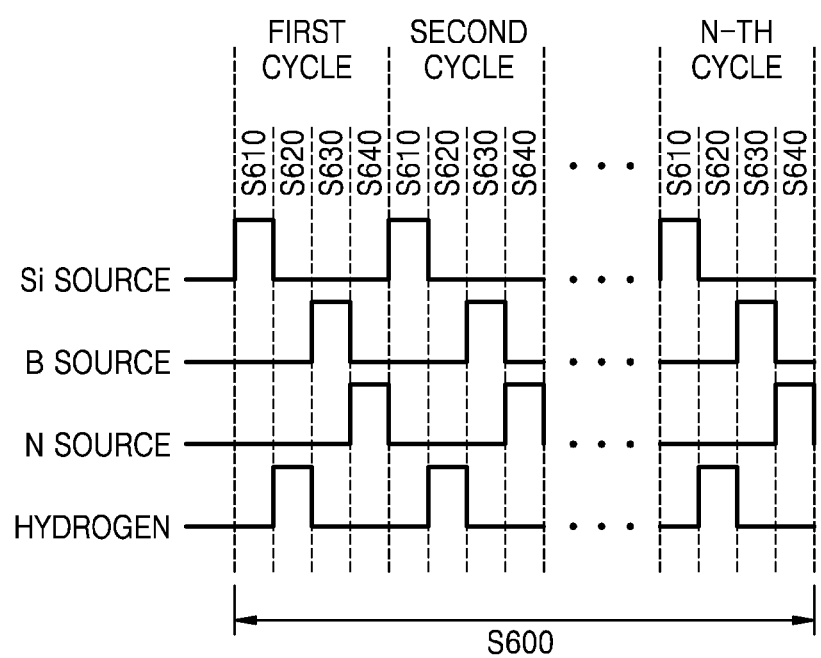
FIG. 10 is a timing diagram of supply cycles for process gases for forming a SiBN material layer according to an example embodiment of the present inventive concepts.

FIG. 10 is a timing diagram of supply cycles of process gases for forming a SiBN material layer according to an example embodiment of the present inventive concepts.

Referring to FIG. 10, after a silicon source may be supplied in pulses in operation S610, a hydrogen gas may be supplied in pulses in operation S620. Then, in operations S630 and S640, a boron source and a nitrogen source, respectively, may be sequentially supplied in pulses. Depending on the type of compound supplied, the sequence of supplying the boron source and the nitrogen source may vary. In some embodiments, hydrogen may be supplied after the silicon source is supplied. Only a purging operation may exist between the operation of supplying a silicon source and the operation of supplying hydrogen.

In FIG. 10, the operation of supplying hydrogen is included in all vapor deposition cycles. However, according to another embodiment, as described above with reference to FIGS. 6A-7B, the operation of supplying hydrogen may be non-uniformly distributed within and/or over the entire vapor deposition process.

Figure 11:
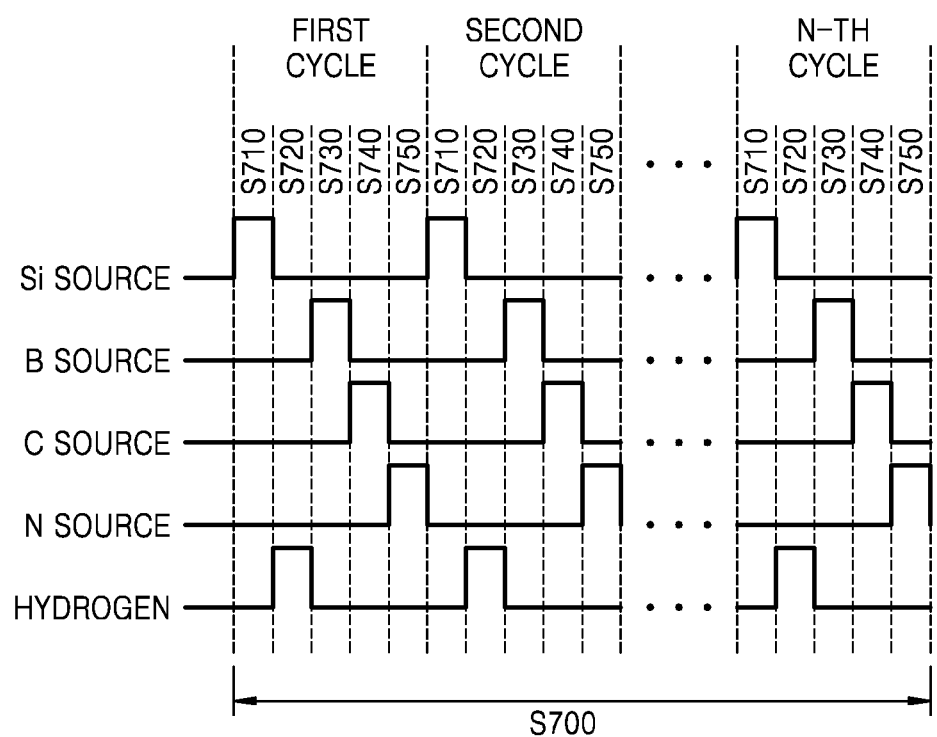
FIG. 11 is a timing diagram of supply cycles for process gases for forming a SiBCN material layer according to an example embodiment of the present inventive concepts.

FIG. 11 is a timing diagram of supply cycles of process gases for forming a SiBCN material layer according to an example embodiment of the present inventive concepts.

Referring to FIG. 11, after a silicon source may be supplied in pulses in operation S710, a hydrogen gas may be supplied in pulses in operation S720. Then, in operations S730, S740, and S750, a boron source, a carbon source, and a nitrogen source, respectively, may be sequentially supplied in pulses. Depending on the type of compound supplied, the sequence of supplying the boron source, the carbon source, and the nitrogen source may vary. In some embodiments, hydrogen may be supplied after the silicon source is supplied. Only a purging operation may exist between the operation of supplying a silicon source and the operation of supplying hydrogen.

In FIG. 11, the operation of supplying hydrogen is included in all vapor deposition cycles. However, according to another embodiment, as described above with reference to FIGS. 6A-7B, the operation of supplying hydrogen may be non-uniformly distributed within and/or over the entire vapor deposition process.

A semiconductor device including the material layer stack will now be described.

Figure 12A:
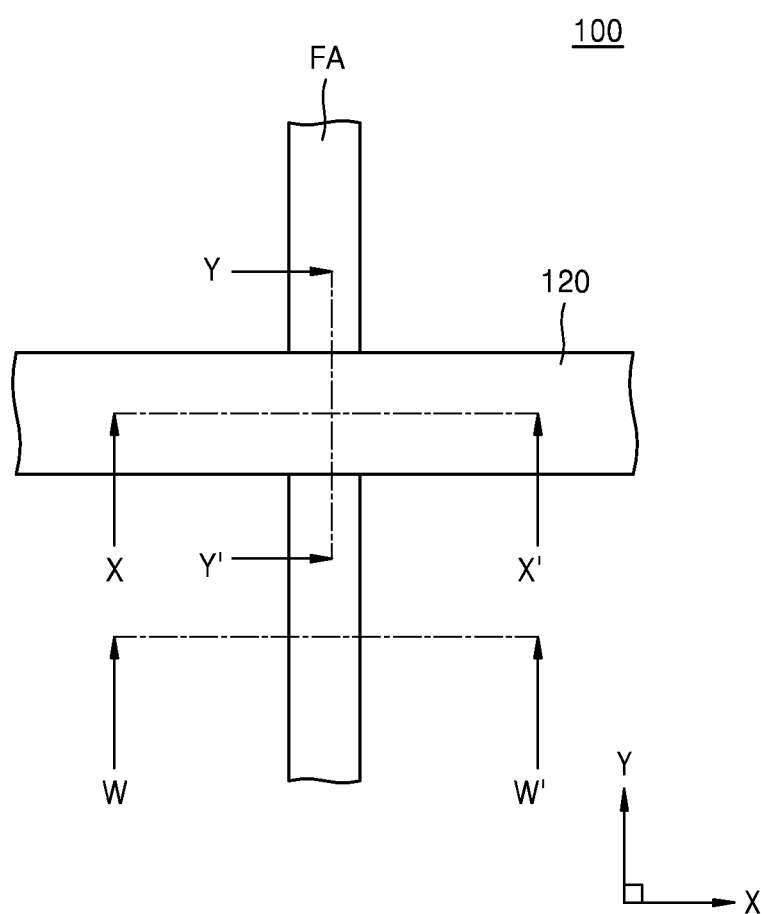
Figure 12B:
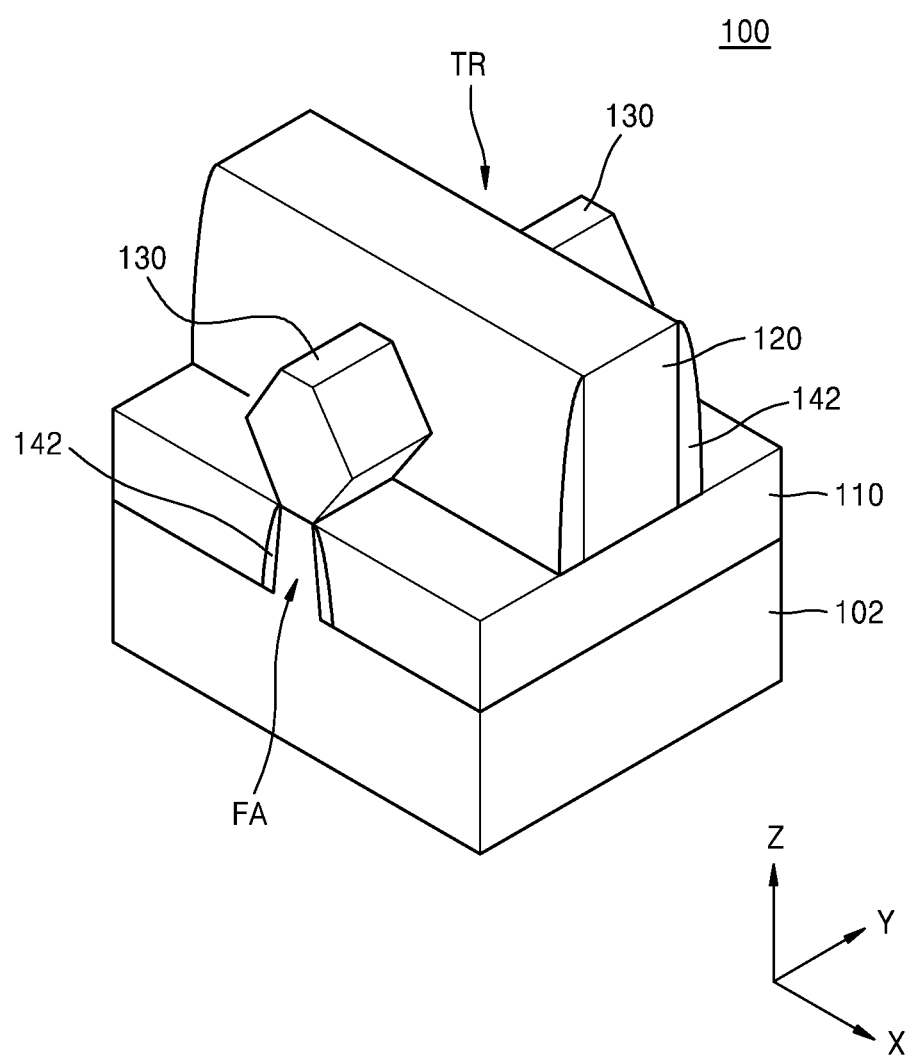
Figure 12C:
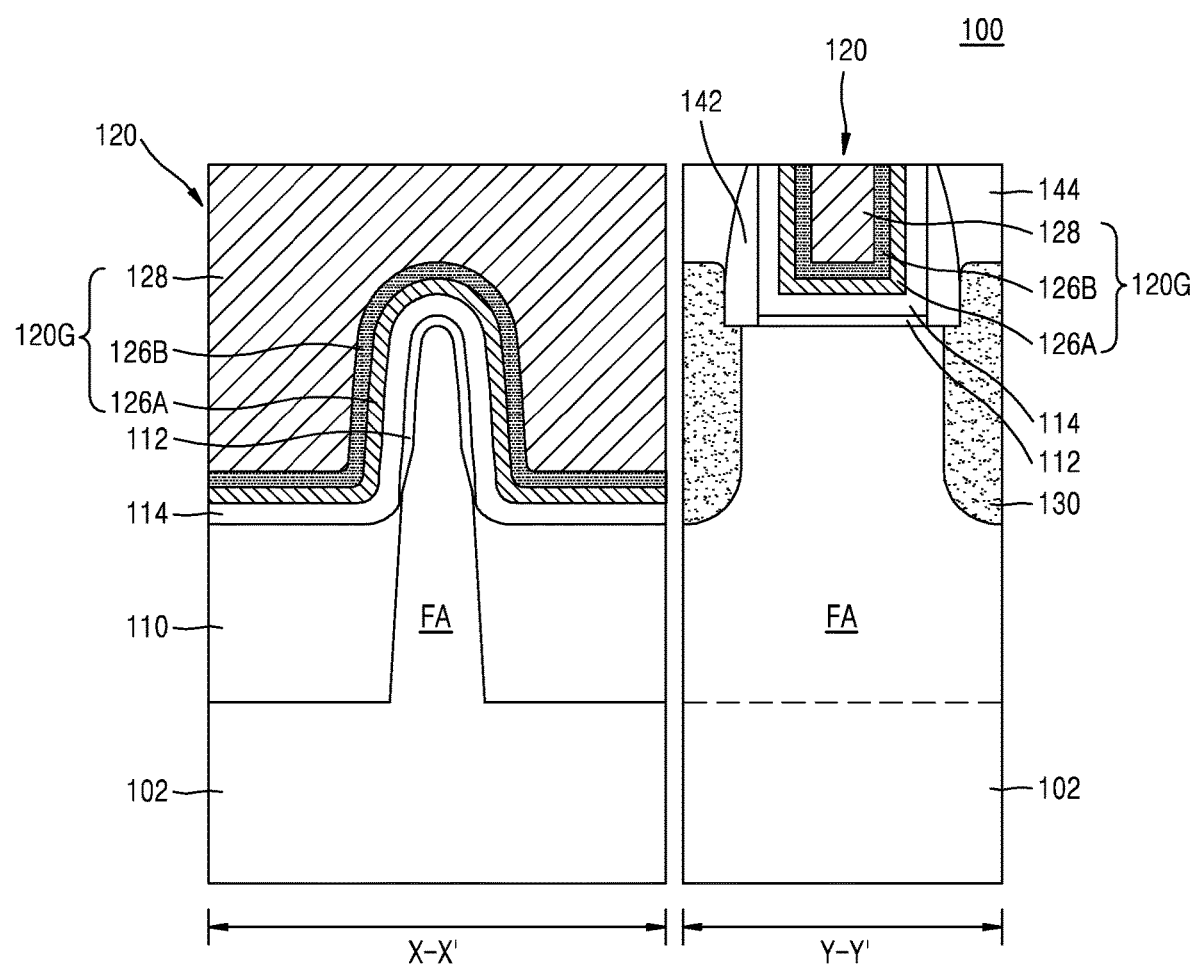

FIGS. 12A to 12C illustrate a semiconductor device 100 having a low-dielectric constant material layer on a semiconductor substrate according to an example embodiment of the present inventive concepts. FIG. 12A is a plan view of the semiconductor device 100, FIG. 12B is a perspective view of the semiconductor device 100, and FIG. 12C is a lateral cross-sectional view of the semiconductor device 100.

Referring to FIGS. 12A to 12C, the semiconductor device 100 includes a fin-type active area FA protruding from a substrate 102.

Since the substrate 11 has been described above with reference to FIG. 1, the substrate 102 will not be described.

The fin-type active area FA may extend in one direction (Y direction in FIGS. 12A and 12B). An isolation layer 110 covering a lower sidewall of the fin-type active area FA is formed on the substrate 102. The fin-type active area FA protrudes in a fin shape on the isolation layer 110. According to some embodiments, the isolation layer 110 may be formed of a silicon oxide layer, a silicon nitride layer, a silicon oxynitride layer, or any combination thereof. However, the present inventive concepts are not limited thereto.

On the fin-type active area FA on the substrate 102, the gate structure 120 may extend in a direction (X direction) that intersects an extending direction of the fin-type active area FA. A pair of source/drain regions 130 may be formed on portions of the fin-type active area FA that are on both sides of the gate structure 120.

The source/drain regions 130 may include a semiconductor layer epitaxially grown from the fin-type active area FA. Each of the source/drain regions 130 may be formed of an embedded SiGe structure including a plurality of epitaxially grown SiGe layers, an epitaxially grown Si layer, or an epitaxially grown SiC layer. Although a case in which the source/drain regions 130 have a specific shape is illustrated in FIG. 12B, a cross-sectional shape of the source/drain regions 130 is not limited to the example of FIG. 12B, and the source/drain regions 130 may have various shapes. For example, the source/drain regions 130 may have any of various cross-sectional shapes such as a circle, an oval, and a polygon.

A MOS transistor TR may be formed at an intersection between the fin-type active area FA and the gate structure 120. The MOS transistor TR is a three-dimensional (3D)

MOS transistor in which a channel is formed on an upper surface and both lateral surfaces of the fin-type active area FA. The MOS transistor TR may constitute an NMOS transistor or a PMOS transistor.

As shown in FIG. 12C, the gate structure 120 may include an interface layer 112, a high-dielectric constant layer 114, a first metal-containing layer 126A, a second metal-containing layer 126B, and a gap-fill metal layer 128 sequentially formed on a surface of the fin-type active area FA. The first metal-containing layer 126A, the second metal-containing layer 126B, and the gap-fill metal layer 128 of the gate structure 120 may constitute a gate electrode 120G.

Insulation spacers 142 may be provided on both sidewalls of the gate structure 120. The insulation spacers 142 may also be provided as source/drain spacers on sidewalls of portions of the fin-type active area FA on both sides of the gate structure 120.

The insulation spacers 142 may each include a low-dielectric constant material layer as described above. In some embodiments, the insulation spacers 142 may be SiOCN material layers. According to some embodiments, each of the insulation spacers 142 may be formed as a single layer. According to some embodiments, each of the insulation spacers 142 may be formed as a multi-layer in which at least two material layers are stacked.

The SiOCN material layer of the insulation spacer 142 may have a dielectric constant of no less than 1 and less than 5.5. According to some embodiments, the SiOCN material layer of the insulation spacer 142 may have a dielectric constant in a range of about 3.5 to about 5.5. According to some embodiments, the SiOCN material layer of the insulation spacer 142 may have a dielectric constant of no less than 1 and less than 4.4.

To have such as low dielectric constant, the SiOCN material layer may include carbon in an amount in a range of about 8 atom % to about 30 atom % and oxygen in an amount in a range of about 32 atom % to about 50 atom %. According to some embodiments, a carbon content may be in an amount in a range of about 11 atom % to about 20 atom %. According to some embodiments, an oxygen content may be in an amount in a range of about 30 atom % to about 48 atom %. According to some embodiments, a carbon content may be in an amount in a range of about 15 atom % to about 20 atom %. According to some embodiments, an oxygen content may be in an amount in a range of about 38 atom % to about 48 atom %.

An interlayer insulation layer 144 may be formed on the insulation spacers 142.

The interface layer 112 may be formed on the surface of the fin-type active area FA. The interface layer 112 may be formed of an insulation material, such as, an oxide layer, a nitride layer, or an oxynitride layer. The interface layer 112 may constitute a gate insulation layer, together with the high-dielectric constant layer 114.

The high dielectric layer 114 may be formed of a material having a higher dielectric constant than a silicon oxide layer. For example, the high-dielectric constant layer 114 may have a dielectric constant in a range of about 10 to about 25. The high dielectric layer 114 may be formed of zirconium oxide, zirconium silicon oxide, hafnium oxide, hafnium oxynitride, hafnium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or any combination thereof, but a material used to form the high dielectric layer 114 is not limited thereto.

According to some embodiments, the first metal-containing layer 126A may include a nitride of Ti, nitride of Ta, oxynitride of Ti, or oxynitride of Ta. For example, the first metal-containing layer 126A may be formed of TiN, TaN, TiAlN, TaAlN, TiSiN, or any combination thereof. The first metal-containing layer 126A may be formed via various vapor deposition methods such as ALD, CVD, and PVD.

According to some embodiments, the second metal-containing layer 126B may be formed of an N-type metal-containing layer necessary for an NMOS transistor including an Al compound containing Ti or Ta. For example, the second metal-containing layer 126B may be formed of TiAlC, TiAlN, TiAlCN, TiAl, TaAlC, TaAlN, TaAlCN, TaAl, or any combination thereof.

According to some embodiments, the second metal-containing layer 126B may be formed of a P-type metal-containing layer necessary for a PMOS transistor. For example, the second metal-containing layer 126B may include at least one of Mo, Pd, Ru, Pt, TiN, WN, TaN, Ir, TaC, RuN, and MoN.

The second metal-containing layer 126B may be formed of a single layer or multiple layers.

The second metal-containing layer 126B may adjust a work function of the gate structure 120, together with the first metal-containing layer 126A. A threshold voltage of the gate structure 120 may be adjusted by work function adjustments by the first metal-containing layer 126A and the second metal-containing layer 126B. According to some embodiments, the first metal-containing layer 126A or the second metal-containing layer 126B may be omitted.

When the gate structure 120 is formed using a replacement metal gate (RMG) process, the gap-fill metal layer 128 may be formed to fill a remaining gate space on the second metal-containing layer 126B. When no gate space remains on the second metal-containing layer 126B after the second metal-containing layer 126B is formed, the gap-fill metal layer 128 may not be formed on the second metal-containing layer 126B.

The gap-fill metal layer 128 may include, for example, W, metal nitride (e.g., TiN or TaN), Al, metal carbide, metal silicide, metal aluminum carbide, metal aluminum nitride, or metal silicon nitride.

An integrated circuit (IC) device including a FinFET having a 3D-structure channel has been described above with reference to FIGS. 12A-12C, but embodiments of the present inventive concepts are not limited thereto. For example, it will be understood by one of ordinary skill in the art that methods of manufacturing IC devices including planar MOSFETs having characteristics according to the present inventive concepts may be provided via various modifications and changes made without departing from the spirit of the above-described inventive concepts.

FIGS. 13A-13F are cross-sectional views illustrating a method of fabricating a semiconductor device, according to an example embodiment of the present inventive concepts. A YY' cross-section and a WW' cross-section in FIGS. 13A to 13F are a YY' cross-section and a WW' cross-section of FIG. 12A, respectively.

Figure 13A:
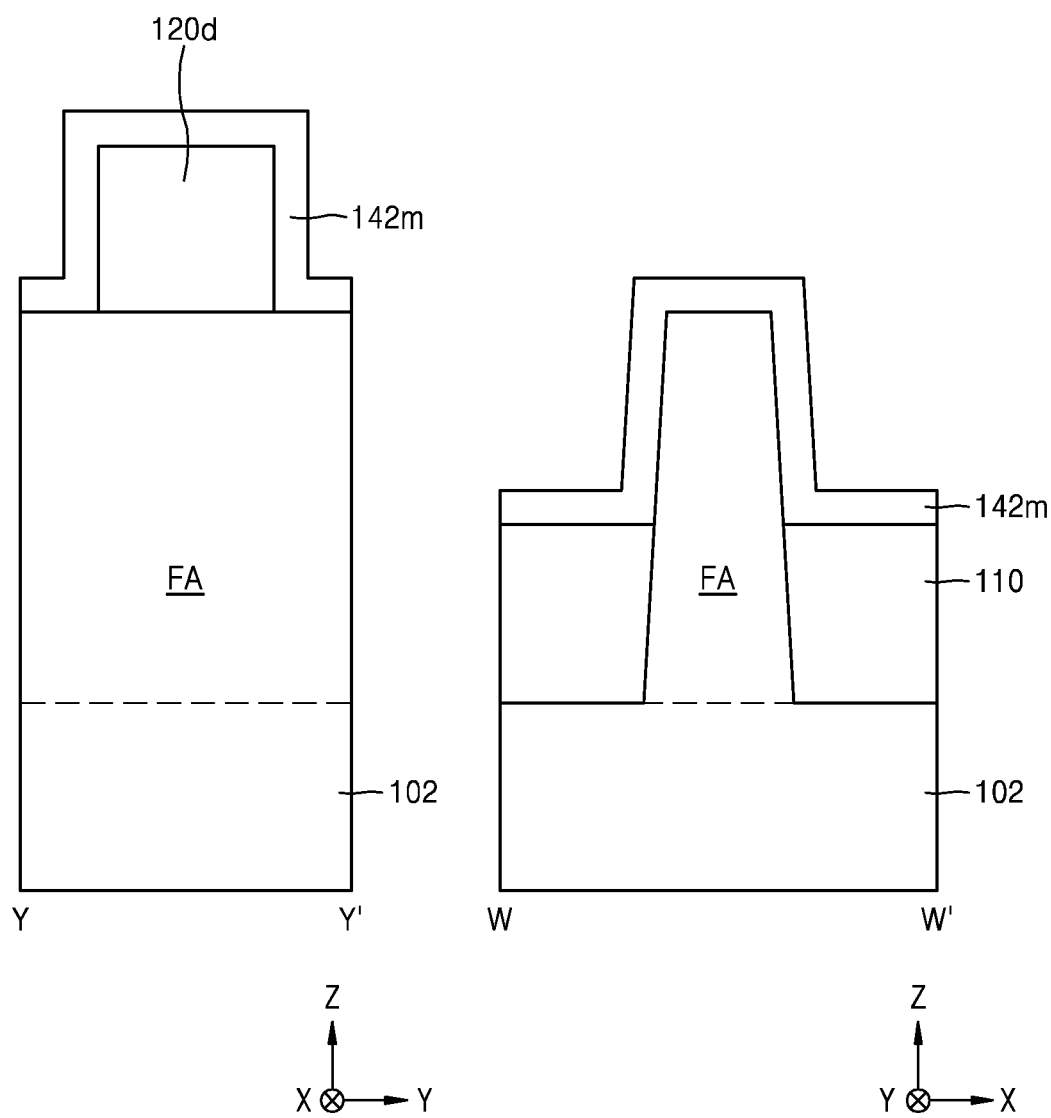
FIGS. 13A-13F are cross-sectional views illustrating a method of fabricating a semiconductor device according to an example embodiment of the present inventive concepts.

Referring to FIG. 13A, after a dummy gate electrode 120d is formed on a substrate 102 in which the fin-type active area FA is defined by the isolation layer 110, a spacer material layer 142m may be conformally deposited on the substrate 102 and the entire surface of the dummy gate electrode 120d.

Since the substrate 11 has been described above with reference to FIG. 1, the substrate 102 will not be described.

The dummy gate electrode 120d may be formed of, for example, polysilicon, but the present inventive concepts are not limited thereto. The dummy gate electrode 120d may be provided to secure a location and/or a space where a gate electrode is to be formed.

The spacer material layer 142m may include the above-described low-dielectric constant material layer. According to some embodiments, the spacer material layer 142m may include a SiOCN material layer. According to some embodiments, the spacer material layer 142m may be formed of a SiOCN single material layer. According to some embodiments, the spacer material layer 142m may be formed of a multi-material layer in which at least two materials layers including SiOCN are stacked.

A method of forming the SiOCN material layer has already been described above with reference to FIGS. 2 to 11, and thus an additional description thereof will be omitted.

Figure 13B:
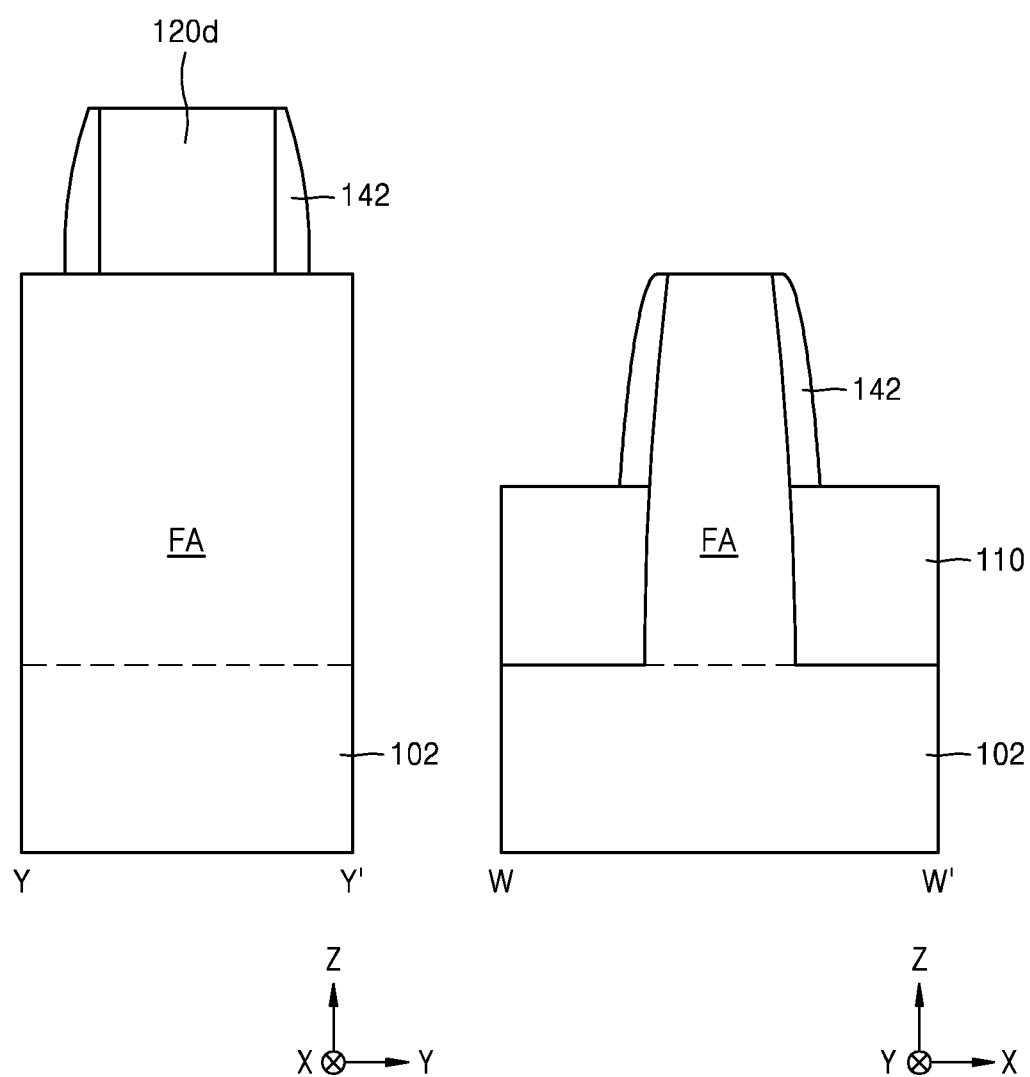

Referring to FIG. 13B, the spacer material layer 142m may be anisotropically etched to form the spacers 142. The spacers 142 may be formed on sidewalls of the dummy gate electrode 120d. The spacers 142 may be formed on sidewalls of a fin-type active area FA that are on both sides of the dummy gate electrode 120d.

Figure 13C:
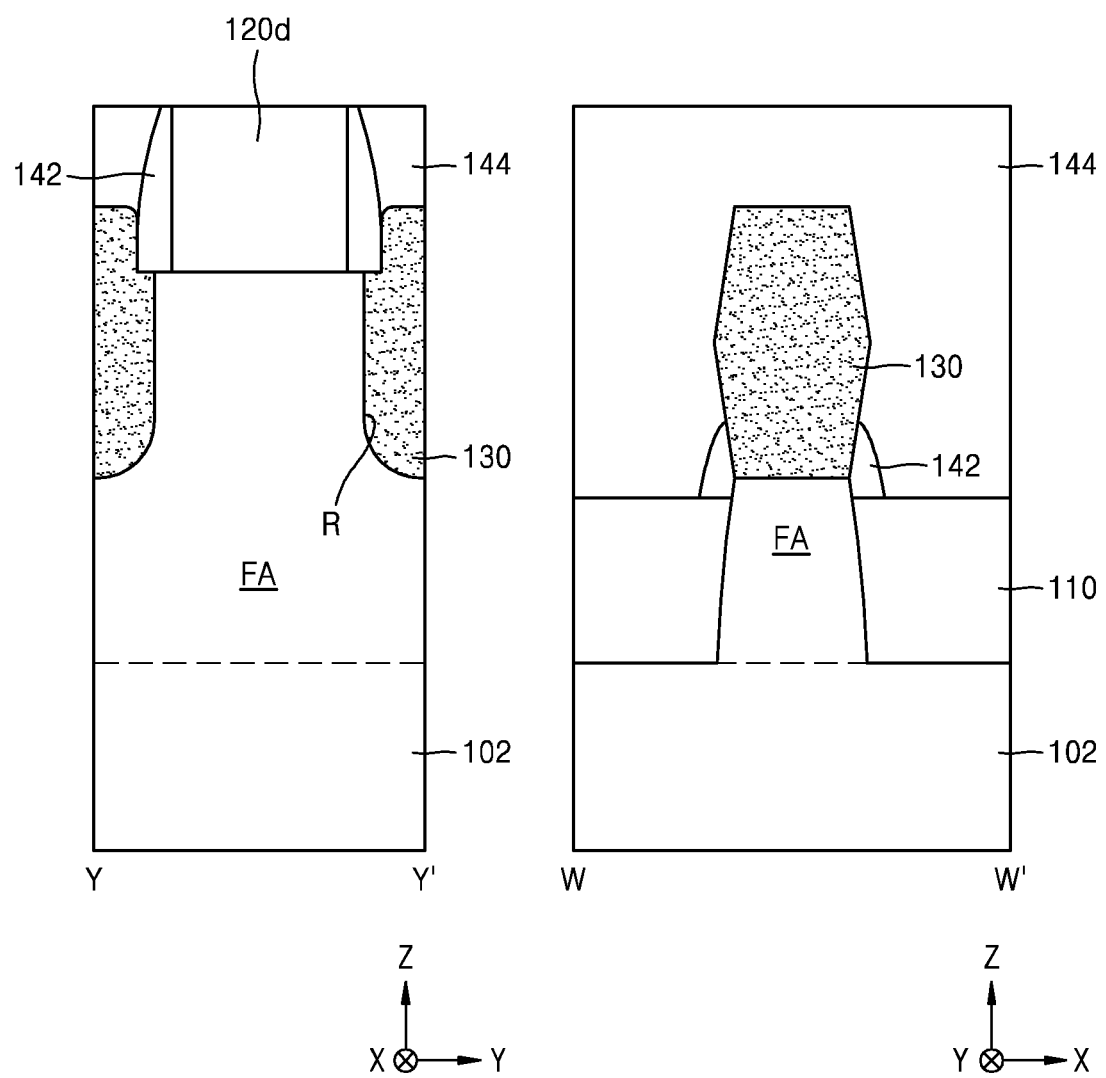

Referring to FIG. 13C, the fin-type active area FA may be partially removed by using the dummy gate electrode 120d and the spacers 142 as an etch mask.

Anisotropic etching and/or isotropic etching may be performed to partially remove the fin-type active area FA. In some embodiments, to expose at least a portion of lower surfaces of the spacers 142 formed on sidewalls of the dummy gate electrode 120d, anisotropic etching and isotropic etching may be combined and thus partial etching may be performed.

In some embodiments, an exposed portion of the fin-type active area FA may be anisotropically etched to a predetermined depth, and then isotropic etching may be performed by wet etching. For example, an $NH_4OH$ solution, a trimethyl ammonium hydroxide (TMAH), an HF solution, an $NH_4F$ solution, or a mixture thereof may be used as an etchant for the wet etching. However, embodiments of the present inventive concepts are not limited thereto.

A recess may be formed by anisotropic etching using the spacers 142 as an etch mask and may undergo the wet etching to thereby obtain a recess R via which the portions of the lower surfaces of the spacers 142 are exposed as shown in FIG. 13C. In some embodiments, the recess R may expose at least portions of lower surfaces of the spacers 142 that are on an impurity region side.

According to some embodiments, wet etching that is performed to expose the portions of the lower surfaces of the spacers 142 may be omitted.

Then, a source/drain material layer may be formed within the recess R to form an impurity region 130. The source/drain material layer may be formed of Si, SiC, or SiGe, but the present inventive concepts are not limited thereto. The source/drain material layer may be formed by, for example, epitaxial growth. Impurities may be injected in situ during epitaxial growth of the source/drain material layer. The impurities may be injected via ion implantation after the source/drain material layer is formed. The impurity region 130 may have an upper surface that is higher than an upper surface of the fin-type active area FA.

Then, the interlayer insulation layer 144 may be formed on the upper surface of the impurity region 130. The interlayer insulation layer 144 may be, for example, silicon nitride, but the present inventive concepts are not limited thereto.

Figure 13D:
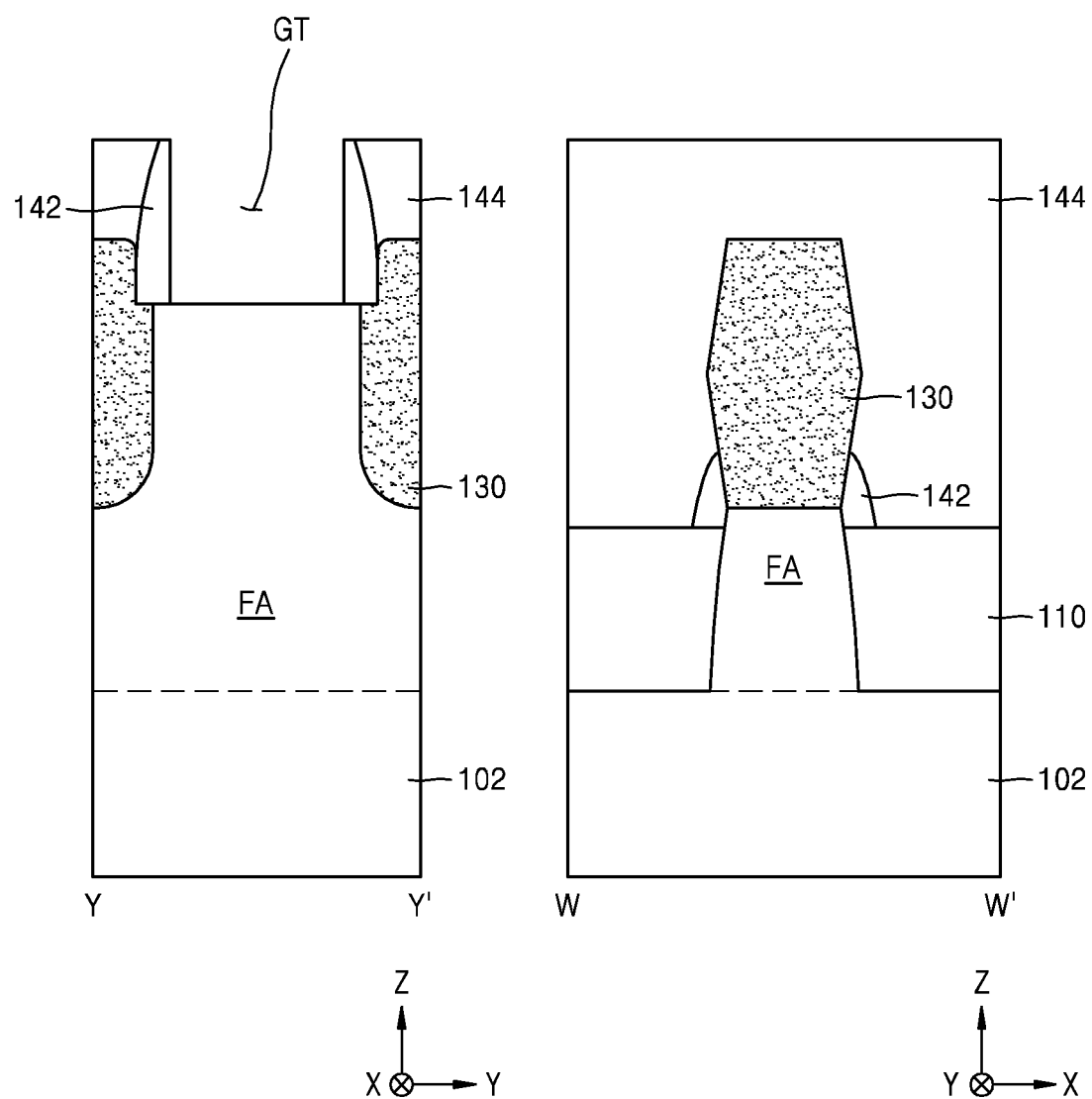

Referring to FIG. 13D, the dummy gate electrode 120d may be removed to form a gate trench GT. An upper surface of the substrate 102 may be partially exposed via the gate trench GT. The portion of the semiconductor substrate 102 exposed via the gate trench GT may correspond to a channel region of the semiconductor device that is to be fabricated later.

The dummy gate electrode 120d may be removed by, for example, dry etching and/or wet etching.

Figure 13E:
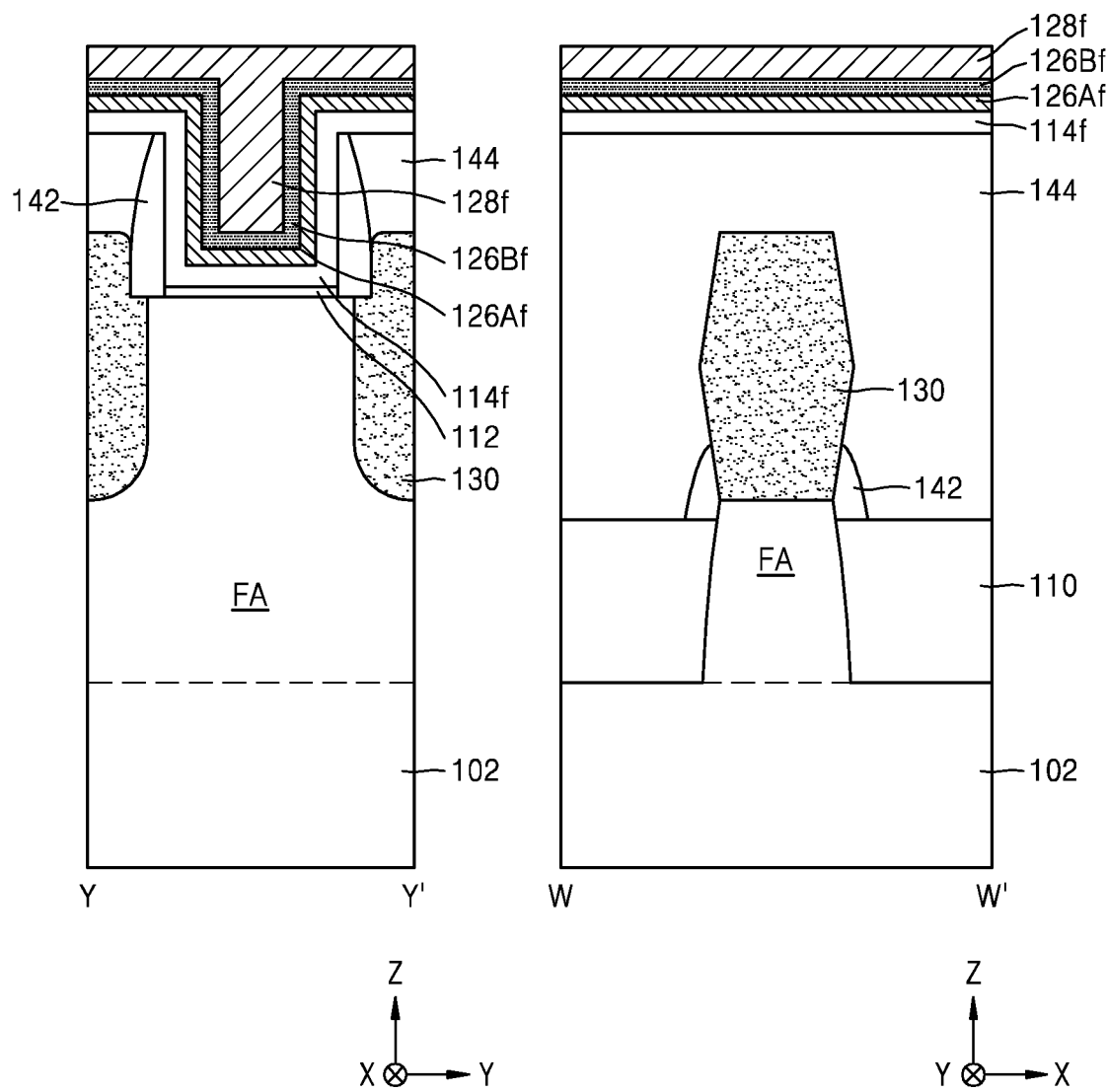

Referring to FIG. 13E, the interface layer 112 may be formed. Then, a high-dielectric constant material layer 114f, a first metal-containing material layer 126Af, a second metal-containing material layer 126Bf, and a gap-fill metal material layer 128f may be sequentially formed on an upper surface of the interface layer 112, the sidewalls of the gate trench GT, and the upper surface of the interlayer insulation layer 144. In some embodiments, the high-dielectric constant material layer 114f, the first metal-containing material layer 126Af, and the second metal-containing material layer 126Bf may be conformally formed along the upper surface of the interface layer 112, the sidewalls of the gate trench GT, and the upper surface of the interlayer insulation layer 144. The gap-fill metal material layer 128f may be formed to fill a trench generated by the second metal-containing material layer 126Bf.

The high-dielectric constant material layer 114f, the first metal-containing material layer 126Af, the second metal-containing material layer 126Bf, and the gap-fill metal material layer 128f may be independently formed by ALD, CVD, or PVD. However, embodiments of the present inventive concepts are not limited thereto.

Figure 13F:
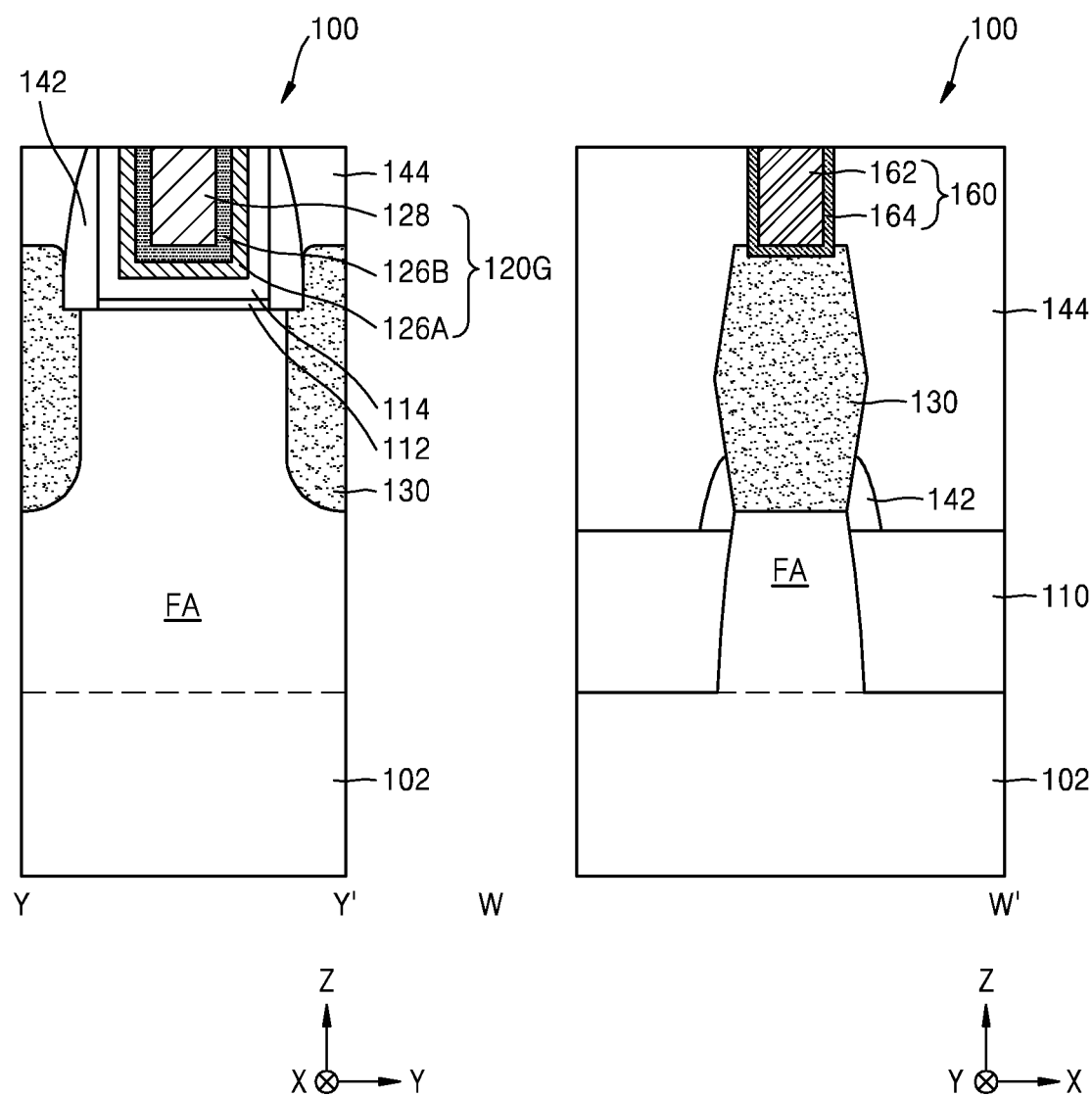

Referring to FIG. 13F, a resultant structure may be planarized until the upper surface of the interlayer insulation layer 144 is exposed, thereby obtaining a final semiconductor device 100. The planarization may be performed by, for example, chemical mechanical polishing (CMP). However, embodiments of the present inventive concepts are not limited thereto.

A contact 160 may be connected to an upper surface of the impurity region 130 that forms the source/drain regions. The contact 160 may include a conductive barrier layer 164 and a wiring layer 162. According to some embodiments, the conductive barrier layer 164 may be formed of titanium nitride, tantalum nitride, tungsten nitride, titanium carbon nitride, or any combination thereof, but is not limited thereto. According to some embodiments, the wiring layer 162 may be formed of a doped semiconductor, metal (such as, e.g., Cu, Ti, W, and/or Al), metal silicide (such as, e.g., nickel silicide, cobalt silicide, tungsten silicide, and/or tantalum silicide), or any combination thereof, but is not limited thereto. The gate electrode 120G and the contact 160 may be electrically insulated from each other by the interlayer insulation layer 144.

Although a source/drain region as an impurity region has a raised source/drain (RSD) structure in FIGS. 12A-12C and FIGS. 13A-13F, the present inventive concepts are not limited thereto. For example, the impurity region 130 may be an impurity-doped region formed in an area corresponding to the fin-type active area FA.

When a material layer forming method according to embodiments of the present inventive concepts is used, a material having a high tolerance to wet etching and/or good electric characteristics even at a lower temperature may be formed.

In some embodiments, a tolerance to wet etching may improve without increasing a carbon content, and thus a material layer having a desired physical property even at a relatively low temperature may be formed.

Figure 14A:
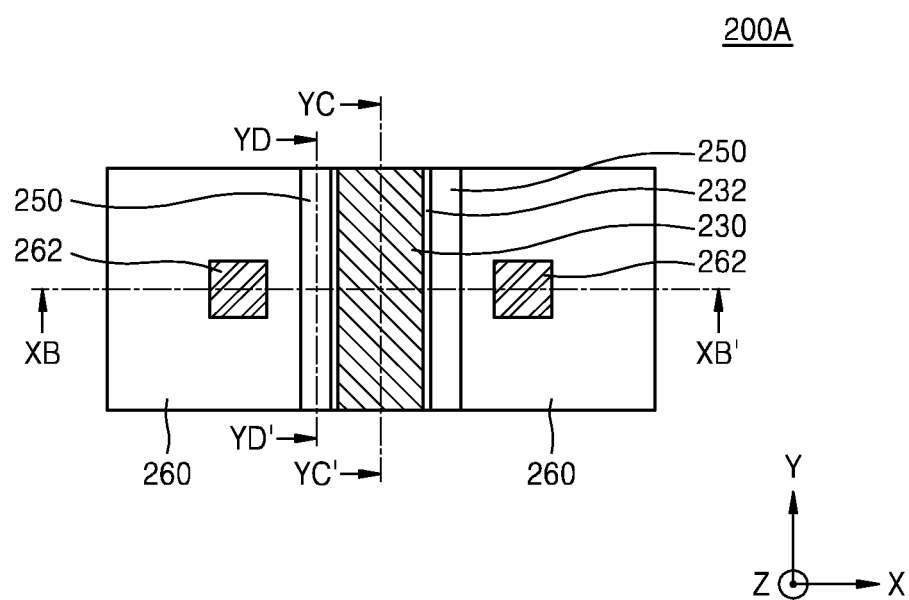
FIGS. 14A-14D are views illustrating essential parts of a semiconductor device according to an example embodiment of the present inventive concepts.
Figure 14B:
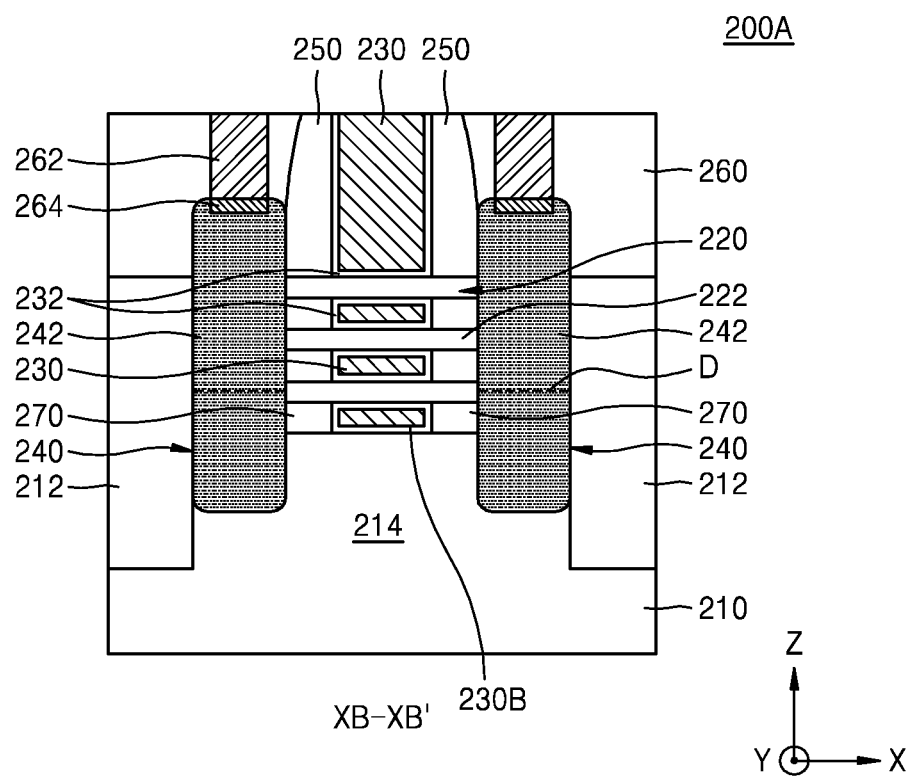
Figure 14C:
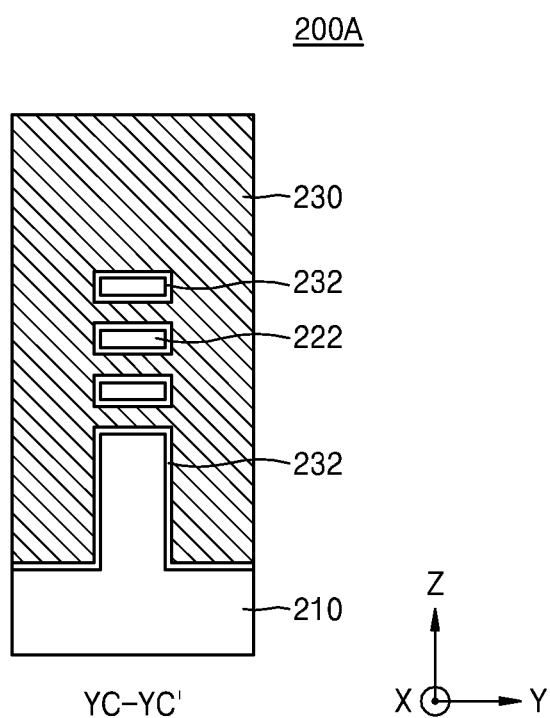
Figure 14D:
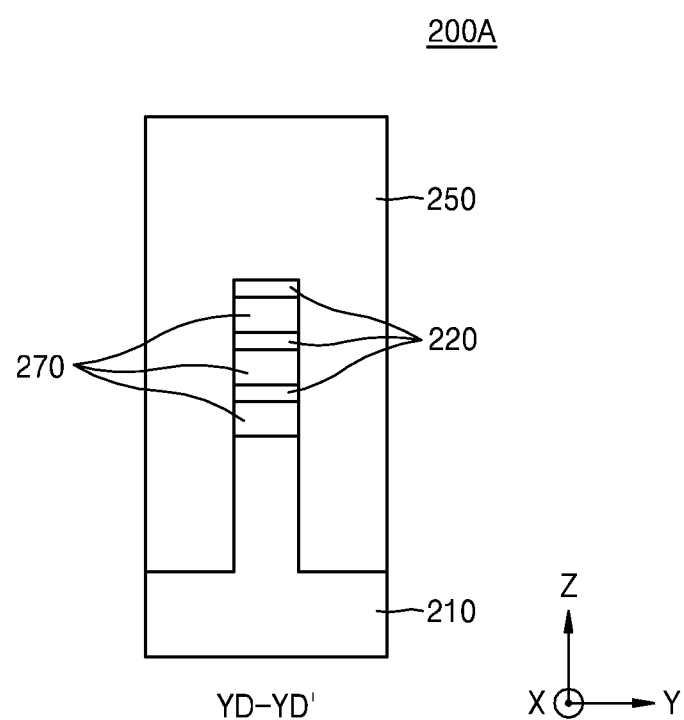

FIGS. 14A-14D are cross-sectional views illustrating essential parts of a semiconductor device 200A, according to example embodiments of the present inventive concepts. In more detail, FIG. 14A is a plan view of the semiconductor device 200A. FIG. 14B is a cross-sectional view taken along line XB-XB' of FIG. 14A. FIG. 14C is a cross-sectional view taken along line YC-YC' of FIG. 14A. FIG. 14D is a cross-sectional view taken along line YD-YD' of FIG. 14D.

Referring to FIGS. 14A-14D, the semiconductor device 200A includes a substrate 210, a nanowire 220 extending in a direction (X direction) parallel to a main surface extending direction of the substrate 210 at a location spaced apart from the substrate 210, and a gate 230 surrounding at least a portion of the nanowire 220.

According to some embodiments, the substrate 210 may be a silicon substrate. According to some embodiments, the substrate 210 may construct a device selected from a system large scale integration (LSI), a logic circuit, an image sensor such as a CMOS image sensor (CIS), a memory device (such as, e.g., a flash memory, a DRAM, an SRAM, an EEPROM, a PRAM, an MRAM, or an RRAM), and a micro-electro-mechanical system (MEMS).

An active area 214 is defined in the substrate 210 by an isolation layer 212. A plurality of wells may be formed in the active area 214 of the substrate 210.

The nanowire 220 includes a channel region 222. The gate 230 surrounds at least a portion of the channel region 222.

The nanowire 220 may be formed of a Group IV element-containing semiconductor, a Group IV and IV elements-containing compound semiconductor, or a Group III and V elements-containing compound semiconductor. According to some embodiments, the nanowire 220 may be formed of Si, Ge, or SiGe. According to some embodiments, the nanowire 220 may be formed of InGaAs, InAs, GaSb, InSb, or any combination thereof.

A gate dielectric layer 232 is interposed between the channel region 222 and the gate 230.

According to some embodiments, the gate dielectric layer 232 may be formed of a silicon oxide layer, a silicon oxynitride layer, a high-dielectric constant layer having a higher dielectric constant than a silicon oxide layer, or any combination thereof. For example, a high-dielectric constant layer that is usable as the gate dielectric layer 232 may be formed of $HfO_2$, HfSiO, HfSiON, HfTaO, HfTiO, HfZrO, zirconium oxide, aluminum oxide, an $HfO_2$—$Al_2O_3$ alloy, or any combination thereof, but the present inventive concepts are not limited thereto.

According to some embodiments, the gate 230 may include doped polysilicon, metal, or any combination thereof. For example, the gate 230 may be formed of Al, Cu, Ti, Ta, W, Mo, TaN, NiSi, CoSi, TiN, WN, TiAl, TiAlN, TaCN, TaC, TaSiN, or any combination thereof, but is not limited thereto.

A pair of semiconductor layers 240 extend until both ends of the nanowire 220 along a direction (Z direction) perpendicular to a main surface of the substrate 210 are formed on the substrate 210. According to some embodiments, the semiconductor layers 240 may each be formed of a SiGe layer, a Ge layer, a SiC layer, or an InGaAs layer, but is not limited thereto.

The semiconductor layers 240 may be semiconductor layers regrown from the substrate 210 and the nanowire 220 by using an epitaxy process. According to some embodiments, the semiconductor layers 240 may be formed of a material different from the substrate 210 and the nanowire 220.

A source/drain region 242 is included in each of the semiconductor layers 240. The source/drain region 242 may be formed by injecting N-type impurity ions or P-type impurity ions into the semiconductor layer 240. The source/drain region 242 may be formed to a depth D indicated by a dotted line. For example, the source/drain region 242 may be formed of a doped SiGe layer, a doped Ge layer, a doped SiC layer, or an doped InGaAs layer, but is not limited thereto.

According to some embodiments, the depth D may be a level higher than a lower surface 230B of the gate 230 that is closest to the substrate 210, as shown in FIG. 14B. However, the present inventive concepts are not limited to this.

The source/drain regions 242 formed within the semiconductor layers 240 may contact both ends of the nanowire 220 and extend up to a level higher than the nanowire 220 along the direction (Z direction) perpendicular to the main surface of the substrate 210.

Both ends of the nanowire 220 that are adjacent to the source/drain regions 242 are covered with outer insulation spacers 250 that cover sidewalls of the gate 230.

The outer insulation spacers 250 may each include the above-described low-dielectric constant material layer. According to some embodiments, the outer insulation spacers 250 may each include a SiOCN material layer. According to some embodiments, the outer insulation spacers 250 may each be formed of a SiOCN single material layer. According to some embodiments, the outer insulation spacers 250 may each be formed of a multi-material layer in which at least two materials layers including SiOCN are stacked.

The SiOCN material layer of each of the outer insulation spacers 250 may have a dielectric constant of no less than 1 and less than 5.5. According to some embodiments, the SiOCN material layer of each of the outer insulation spacers 250 may have a dielectric constant in a range of about 3.5 to about 5.5. According to some embodiments, the SiOCN material layer of each of the outer insulation spacers 250 may have a dielectric constant of no less than 1 and less than 4.4.

To have such a low dielectric constant, the SiOCN material layer may include carbon in an amount in a range of about 8 atom % to about 30 atom % and oxygen in an amount in a range of about 32 atom % to about 50 atom %. According to some embodiments, a carbon content may be in an amount in a range of about 11 atom % to about 20 atom %. According to some embodiments, an oxygen content may be in an amount in a range of about 30 atom % to about 48 atom %. According to some embodiments, the carbon content may be in an amount in a range of about 15 atom % to about 20 atom %. According to some embodiments, the oxygen content may be in an amount in a range of about 38 atom % to about 48 atom %.

A portion of the source/drain region 242 and a portion of the outer insulation spacer 250 are covered with an insulation layer 260. The source/drain regions 242 are connected to contacts that penetrate through the insulation layer 260. Metal silicide layers 264 may be formed between the source/drain regions 242 and the contacts 262. By forming the metal silicide layers 264 on surfaces of the source/drain regions 242, resistance of the source/drain regions 242 and resistance of the contacts 262 may be reduced. According to some embodiments, the metal silicide layers 264 may be, but are not limited thereto, a cobalt silicide layer. According to some embodiments, the metal silicide layers 264 may not be formed.

A pair of inner insulation spacers 270 are formed between the substrate 210 and the nanowire 220. The inner insulation spacers 270 are interposed between the gate 230 and the source/drain regions 242. The inner insulation spacers 270 may be formed of a different material from the gate dielectric layer 232.

The gate dielectric layer 232 extends from a surface of the channel region 222 of the nanowire 220 to sidewalls of the inner insulation spacers 270 between the substrate 210 and the nanowire 220 such that the gate dielectric layer 232 is interposed between the gate 230 and the inner insulation spacers 270.

According to some embodiments, the inner insulation spacers 270 may be formed of a material different from a material used to form the gate dielectric layer 232. According to some embodiments, the inner insulation spacers 270 may be formed of a material having a dielectric constant smaller than that of the material used to form the gate dielectric layer 232. According to some embodiments, the inner insulation spacers 270 may each be formed of an oxide of a Group IV element-containing semiconductor, oxide of a Group IV and IV elements-containing compound semiconductor, oxide of a Group III and V elements-containing compound semiconductor, or silicon oxide. For example, the inner insulation spacers 270 may each be formed of an oxide of SiGe, oxide of InP, or silicon oxide, but are not limited thereto.

The outer insulation spacers 250 and the inner insulation spacers 270 are spaced apart from each other in the direction (Z direction) perpendicular to the main surface extending direction of the substrate 210 and overlap with each other in the perpendicular direction. According to some embodiments, the inner insulation spacers 270 may be formed of a material different from a material used to form the outer insulation spacers 250. According to some embodiments, the inner insulation spacers 270 may be formed of a material having a dielectric constant smaller than that of the material used to form the outer insulation spacers 250.

The semiconductor device 200A may constitute a transistor. According to some embodiments, when an N-type well is formed in the active area 214 of the substrate 210 and the source/drain regions 242 are doped with P-type impurities, the semiconductor device 200A may constitute a PMOS transistor. According to some embodiments, when a P-type well is formed in the active area 214 of the substrate 210 and the source/drain regions 242 are doped with N-type impurities, the semiconductor device 200A may constitute an NMOS transistor.

A carrier mobility of a MOS transistor greatly affects power consumption and switching performance of a device. By improving the carrier mobility, a switching speed may be increased and an operation at a low voltage is possible, and thus power consumption may be reduced. According to some embodiments, to improve the carrier mobility of the semiconductor device 200A that constitutes a MOS transistor, the channel region 222 of the nanowire 220 may have a strained channel.

For example, when the semiconductor device 200A constitutes a PMOS transistor, to provide a nanowire 220 having a strained channel, the nanowire 220 may be formed of Si and the source/drain regions 242 connected to both ends of the nanowire 220 may be formed of doped SiGe or doped Ge. As another example, when the semiconductor device 200A constitutes a PMOS transistor, to provide a nanowire 220 having a strained channel, the nanowire 220 may be formed of Ge and the source/drain regions 242 may be formed of SiGe. As another example, when the semiconductor device 200A constitutes an NMOS transistor, to provide a nanowire 220 having a strained channel, the nanowire 220 may be formed of Si and the source/drain regions 242 may be formed of doped SiC.

What is claimed is:

1. A method of forming a SiOCN material layer, the method comprising performing a plurality of first deposition cycles, each performance of the first deposition cycle comprising ordered operations of:
   supplying a silicon source onto a substrate; then
   supplying hydrogen onto the substrate; then
   supplying a carbon source onto the substrate; then
   supplying an oxygen source onto the substrate; and then
   supplying a nitrogen source onto the substrate, thereby forming the SiOCN material layer, and
   the method further comprising performing a plurality of second deposition cycles performed prior to the plurality of the first deposition cycles, each performance of the second deposition cycle comprising ordered operations of: supplying the silicon source onto the substrate, supplying the carbon source onto the substrate, supplying the oxygen source onto the substrate, supplying the nitrogen source onto the substrate,
   wherein the plurality of second deposition cycles are devoid of supplying hydrogen onto the substrate,
   wherein at least one of the supplying of the silicon source, the supplying of the carbon source, and the supplying of the nitrogen source of the first deposition cycle comprises supplying RF power for forming plasma; and
   wherein the method comprises:
   a first phase comprising forming a first portion of the SiOCN material layer having a first thickness;
   a second phase comprising forming a second portion of the SiOCN material layer having a second thickness, wherein the second phase is after the first phase; and
   a third phase comprising forming a third portion of the SiOCN material layer having a third thickness, wherein the third phase is after the second phase,
   wherein each of the first phase, second phase, and third phase comprises performing the plurality of first deposition cycles and/or the plurality of second deposition cycles, and wherein the first deposition cycle is performed only in the first phase and the third phase and the first deposition cycle is not performed in the second phase.

2. The method of claim 1, wherein the silicon source is a silane-based silicon precursor substituted with a halogen.

3. The method of claim 1, wherein the supplying of the hydrogen onto the substrate is performed at a temperature in a range of about 400° C. to about 700° C.

4. The method of claim 1, wherein the method further comprises performing at least one deposition cycle that comprises in the following order: supplying of the silicon source onto the substrate, then supplying of the hydrogen onto the substrate, then supplying of the carbon source onto the substrate, then supplying of the oxygen source onto the substrate, and then supplying of the nitrogen source onto the substrate, and
   wherein the supplying of the nitrogen source onto the substrate in the at least one deposition cycle is followed by performing a next deposition cycle that begins with the supplying of the silicon source onto the substrate.

5. The method of claim 4, wherein the method further comprises performing at least one deposition cycle that comprises in the following order: supplying of the silicon source onto the substrate, then a first supplying of the carbon source onto the substrate, then supplying of the oxygen source onto the substrate, then supplying of the nitrogen source onto the substrate, and then a second supplying of the carbon source onto the substrate, and wherein, after the second supplying of the carbon source onto the substrate, a subsequent deposition cycle begins with the supplying of the silicon source onto the substrate.

6. The method of claim 1, wherein the supplying of the hydrogen does not include generating and/or supplying plasma.

7. A method of forming a low-dielectric constant material layer, the method comprising performing a plurality of first deposition cycles, each performance of the first deposition cycle comprising ordered operations of:

supplying a silicon source onto a substrate;

supplying hydrogen onto the substrate directly after the supplying of the silicon source; and supplying an additional component source onto the substrate directly after the supplying of the hydrogen, and the method further comprising performing a plurality of second deposition cycles performed prior to the plurality of first deposition cycles, each performance of the second deposition cycles comprising operations of:

supplying the silicon source onto the substrate, and supplying the additional component source onto the substrate, wherein the plurality of second deposition cycles are devoid of supplying hydrogen onto the substrate, wherein the supplying of the additional component source comprises supplying a carbon source, and wherein the method comprises:

a first phase comprising forming a first portion of the low-dielectric constant material layer having a first thickness;

a second phase comprising forming a second portion of the low-dielectric constant material layer having a second thickness, wherein the second phase is after the first phase; and a third phase comprising forming a third portion of the low-dielectric constant material layer having a third thickness, wherein the third phase is after the second phase, wherein each of the first phase, second phase, and third phase comprises performing the plurality of first deposition cycles and/or the plurality of second deposition cycles, and wherein the first deposition cycle is performed only in the first phase and the third phase and the first deposition cycle is not performed in the second phase.

8. The method of claim 7, wherein the supplying of the additional component source further comprises supplying at least one of an oxygen source, a boron source, and a nitrogen source.

9. The method of claim 8, wherein the supplying of the additional component source further comprises supplying the nitrogen source, and the supplying of the carbon source is followed by the supplying of the nitrogen source.

10. The method of claim 8, wherein the supplying of the additional component source comprises supplying the oxygen source, and the supplying of the carbon source is followed by the supplying of the oxygen source.

11. The method of claim 8, wherein the supplying of the additional component source comprises supplying the boron source and supplying the nitrogen source, and the supplying of the boron source is followed by the supplying of the nitrogen source.

12. The method of claim 8, wherein the supplying of the additional component source comprises supplying the boron source and the nitrogen source, the supplying of the boron source is followed by the supplying of the carbon source, and the supplying of the carbon source is followed by the supplying of the nitrogen source.

13. A method of forming a SiOCN material layer, the method comprising:

performing a plurality of first deposition cycles, each performance of the first deposition cycle comprising separately supplying a silicon source onto a substrate directly followed by supplying hydrogen onto the substrate, and performing a plurality of second deposition cycles before the plurality of first deposition cycles, wherein each performance of the first deposition cycle comprises separately supplying the silicon source, the hydrogen, and a carbon source onto the substrate, wherein each performance of the second deposition cycle comprises supplying the silicon source onto the substrate and does not include supplying the hydrogen onto the substrate, thereby forming the SiOCN material layer, and wherein the method comprises:

a first phase comprising forming a first portion of the SiOCN material layer having a first thickness;

a second phase comprising forming a second portion of the SiOCN material layer having a second thickness, wherein the second phase is after the first phase; and a third phase comprising forming a third portion of the SiOCN material layer having a third thickness, wherein the third phase is after the second phase, wherein each of the first phase, second phase, and third phase comprises performing the plurality of first deposition cycles and/or the plurality of second deposition cycles, and wherein the first deposition cycle is performed only in the first phase and the third phase and the first deposition cycle is not performed in the second phase.

14. The method of claim 13, wherein each performance of the first deposition cycle further comprises supplying a carbon source, an oxygen source, a nitrogen source, and/or a boron source onto the substrate.

15. The method of claim 13, wherein each performance of the second deposition cycle further comprises supplying a carbon source, an oxygen source, and/or a nitrogen source onto the substrate.

16. The method of claim 13, further comprising repeating the performing the plurality of second deposition cycles after the plurality of first deposition cycles.

* * * * *